United States Patent [19]
Ogura

[11] Patent Number: 6,147,916
[45] Date of Patent: Nov. 14, 2000

[54] SEMICONDUCTOR MEMORY DEVICE WITH PRECHARGE VOLTAGE CORRECTION CIRCUIT

[75] Inventor: Kiyonori Ogura, Kasugai, Japan

[73] Assignee: Fujitsu Limited, Kawasaki, Japan

[21] Appl. No.: 09/433,078

[22] Filed: Nov. 3, 1999

[30] Foreign Application Priority Data

Nov. 4, 1998 [JP] Japan ................................. 10-313496

[51] Int. Cl.[7] ................................................ G11C 7/00
[52] U.S. Cl. ............................................................ 365/203
[58] Field of Search .................................... 365/203, 194, 365/233, 226

[56] References Cited

U.S. PATENT DOCUMENTS

| | | | |
|---|---|---|---|
| 4,404,660 | 9/1983 | Menachem | 365/203 |
| 5,379,265 | 1/1995 | Yamada et al. | 365/203 |
| 5,434,822 | 7/1995 | Deleganes et al. | 365/203 |
| 5,604,704 | 2/1997 | Atsumo | 365/203 |
| 5,636,169 | 6/1997 | Oh | 365/203 |
| 5,689,470 | 11/1997 | Inoue | 365/203 |
| 5,892,722 | 4/1999 | Jang et al. | 365/203 |

*Primary Examiner*—Trong Phan
*Attorney, Agent, or Firm*—Arent Fox Kintner Plotkin & Kahn

[57] ABSTRACT

A semiconductor memory device, such as a DRAM, includes a memory cell array and pairs of bit lines connected to the memory cells in the array. A precharge circuit is connected the bit line pairs and selectively provides the bit line pairs with a reference power supply voltage when the memory cells are being accessed and a precharge voltage when the memory cells are not being accessed. A correction circuit adjusts the precharge voltage in accordance with a difference between the precharge voltage and the reference power supply voltage so that the precharge voltage becomes substantially equal to the reference power supply voltage. A retention mode determination circuit detects when the memory device is in a retention mode (powered down state) and prevents access to the memory cells at this time.

13 Claims, 15 Drawing Sheets

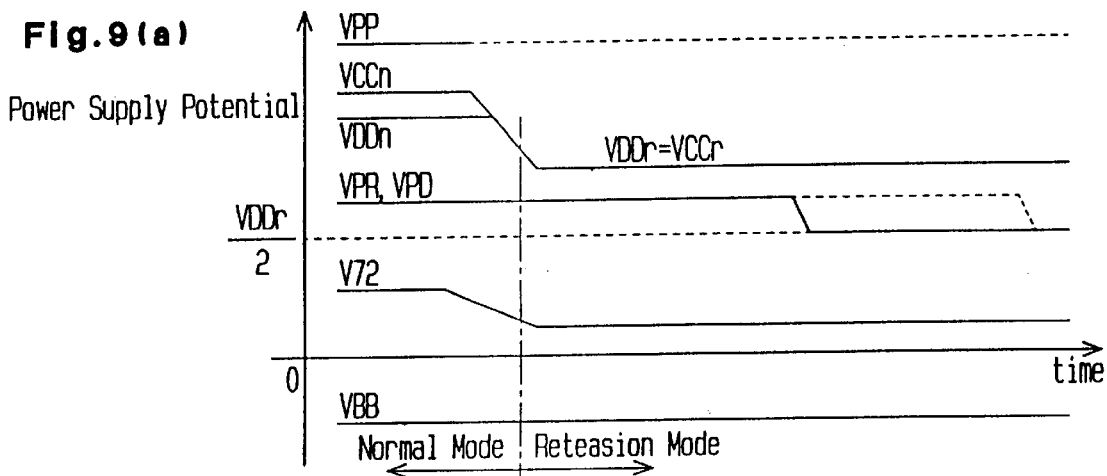
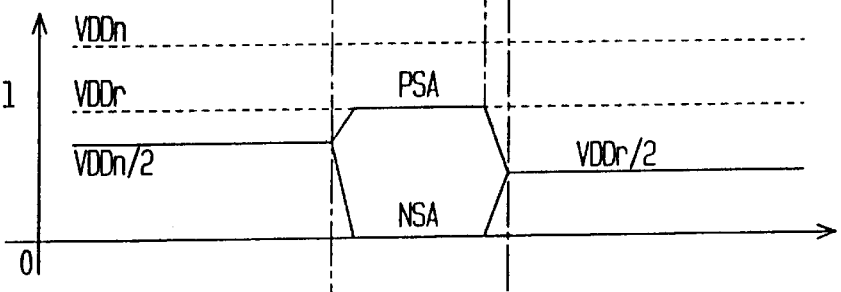
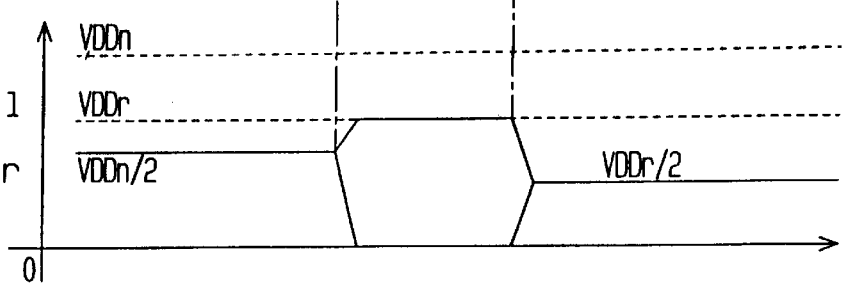

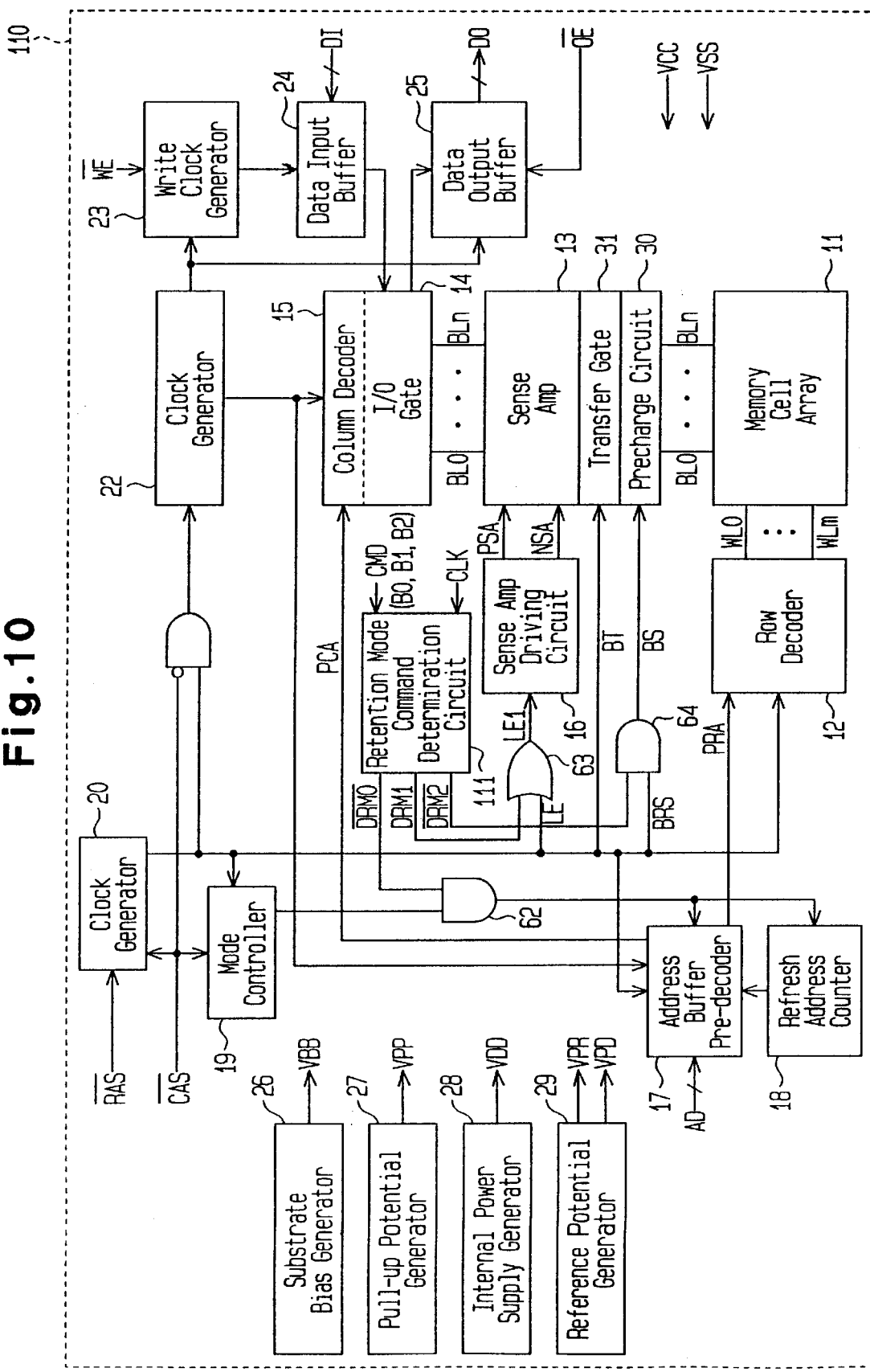

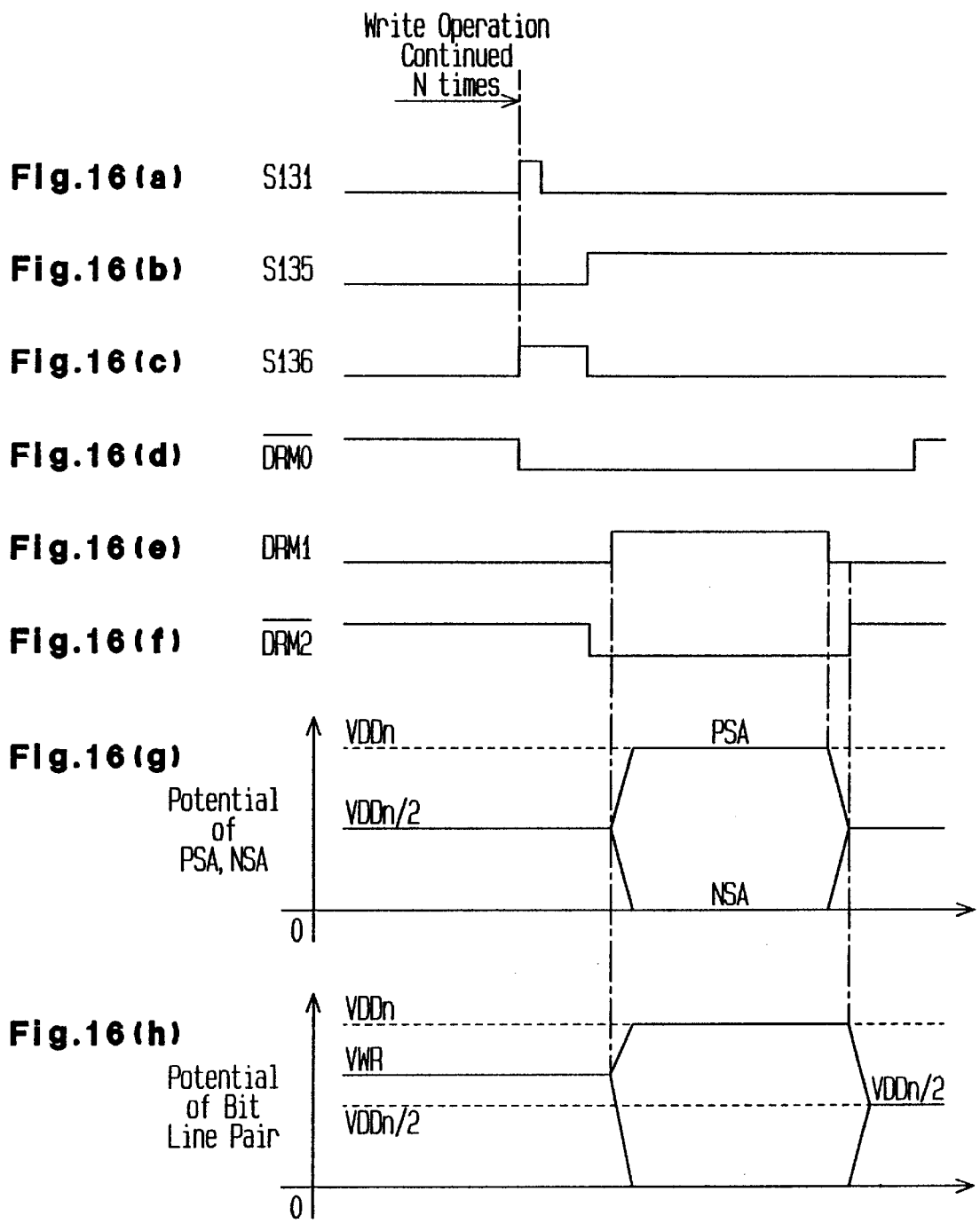

SEMICONDUCTOR MEMORY DEVICE WITH PRECHARGE VOLTAGE CORRECTION CIRCUIT

BACKGROUND OF THE INVENTION

The present invention relates to data retention in a random access memory (DRAM). More specifically, the present invention relates to guaranteeing data retention in a DRAM employed in a system which decreases the DRAM power supply voltage when the DRAM is in a standby state, such as a power save mode or a battery backup mode, to reduce power consumption.

In recent years, more electronic devices, such as personals computers incorporating DRAMs, use batteries as power sources. Power consumption in such electronic devices must be decreased in order to increase the operation time of the electronic device or to decrease the required capacity of the battery.

A DRAM provided with a retention mode function, which decreases or bumps down the supply voltage when in a standby state, has been proposed to decrease power consumption in electronic devices. In the retention mode, after the DRAM enters a standby state and the power supply is bumped down, the internal operation is decreased to a level which is just sufficient for retaining data.

As shown in FIG. 1, a prior art DRAM 10 is formed on a semiconductor substrate (not shown) using known semiconductor integrated circuit technology. The DRAM 10 is provided with high potential and low potential external power supplies VCC, VSS (ground voltage) and operated in accordance with the levels of the external power supplies VCC, VSS. The DRAM 10 receives various signals from a controller (not shown), such as a clock signal CLK, an address signal (row and column address signal) AD, a row address strobe signal (hereafter referred to as row signal) /RAS, a column address strobe signal (hereafter referred to as column signal) /CAS, a write control signal /WE, and an output control signal /OE. When data is written, the DRAM 10 receives a data signal DI from the controller. The DRAM 10 is controlled in accordance with the state of the control signals.

The DRAM 10 includes a memory cell array 11, a row decoder 12, sense amplifiers 13, an input/output (I/O) gate 14, a column decoder 15, a sense amplifier driving circuit 16, a data input buffer 24, and a data output buffer 25. The row decoder 12 is connected to the memory cell array 11 by word lines WL0 to WLm. The sense amplifiers 13 are connected to the memory cell array 11 via a precharge circuit 30 and a transmission gate 31 by bit line pairs BL0, /BL0 to BLn, /BLn. The input/output gate 14 and the column decoder 15 are connected to the sense amplifiers 13 by the bit line pairs BL0, /BL0 to BLn, /BLn. The sense amplifiers 13 are further connected to the sense amplifier driving circuit 16 which activates the sense amplifiers 13.

The DRAM 10 also includes an address buffer pre-decoder 17, a refresh address counter 18, a mode controller 19, first and second clock generators 20, 22, and a write clock generator 23.

Furthermore, the DRAM 10 includes a substrate bias generator 26, a pull-up voltage generator 27, an internal power supply generator 28, and a reference voltage generator 29. The substrate bias generator 26 generates substrate bias power supply VBB having a level corresponding to the levels of the high potential and low potential power supplies VCC, VSS. The pull-up voltage generator 27 generates pull-up power supply VPP, which is sent to a write amplifier (not shown), in accordance with the levels of the high potential and low potential power supplies VCC, VSS. The internal power supply generator 28 generates internal power supply VDD, which is sent to each section of the DRAM 10 except for the memory cell array 11 and the write amplifier, in accordance with the levels of the high potential and low potential power supplies VCC, VSS.

As shown in FIG. 4, the reference voltage generator 29 includes a pair of high resistors 35, 36, which are connected in series between the internal power supply VDD and the low potential power supply VSS, and a compensation circuit 37. The high resistors 35, 36 have substantially the same resistance value. Reference power supplies VPR, VPD having values that are half of that of the internal power supply VDD are output from a node between the high resistors 35, 36. The reference power supply VPR is provided to the precharge circuit 30, and the reference power supply VPD is sent to the memory cell array 11.

The relationship between the voltages of the external power supplies VCC, VSS and the voltages of the substrate bias power supply VBB, the pull-up power supply VPP, the internal power supply VDD, the reference power supply VPR, and the reference power supply VPD are shown in FIG. 5.

The substrate bias power supply VBB voltage decreases so that it becomes lower than the low potential power supply VSS voltage as the external power supply VCC voltage increases. When the external power supply VCC reaches voltage VCCr, which is the value when entering the retention mode, the substrate bias power supply VBB becomes constant at a negative value.

The internal power supply VDD voltage increases proportionally to the external power supply VCC voltage so that it is equal to the external power supply VCC voltage. When the internal power supply VDD reaches a normal mode VCC range, the internal power supply VDD becomes constant at a positive value.

The pull-up power supply VPP voltage increases proportionally to the external power supply VCC voltage so that it is greater than the external power supply VCC voltage. When the pull-up power supply VPP voltage reaches the normal mode VCC range, the pull-up power supply VPP becomes constant at a value greater than the internal power supply VDD voltage.

The reference power supply VPR voltage and the reference power supply VPD voltage increase proportionally to the external power supply VCC voltage until they become one half the level of the internal power supply voltage VDD. When the external power supply VCC reaches the normal mode VCC range, the reference power supply VPR voltage and the reference power supply VPD voltage are one half the level of the internal power supply VDD voltage.

Returning to FIG. 1, the clock generator 20 receives the row signal /RAS and the column signal /CAS from the controller and controls the address buffer pre-decoder 17 in accordance with the row signal /RAS. The clock generator 20 generates an activation signal LE and a first precharge signal BRS based on the row signal /RAS and the column signal /CAS and sends the activation signal LE and the first precharge signal BRS to the sense amplifier driving circuit 16 and the precharge circuit 30, respectively. The activation signal LE is high for a predetermined time after selection of a memory cell. The first precharge signal BRS is high when memory cell selection is not being performed and low when memory cell selection is being performed.

The mode controller 19 receives the row signal /RAS from the clock generator 20 and the column signal /CAS and determines the refresh mode in accordance with the levels of the signals /CAS, /RAS. Refresh modes include a known RAS only refresh mode, a CBR refresh mode, and a self refresh mode. The mode controller 19 controls the address buffer pre-decoder 17 and the refresh address counter 18 in accordance with the determined refresh mode. The refresh address counter 18 is operated in accordance with the control signal from the mode controller 19 during the refresh mode and the self refresh mode. More specifically, the refresh address counter 18 counts the refresh address (row address) of the memory cells that should be refreshed and sends the count value to the address buffer pre-decoder 17.

An AND circuit 21 has an input terminal for receiving the column signal /CAS and the control signal from the clock generator 20 and an output terminal connected to the clock generator 22. The clock generator 22 controls the address buffer pre-decoder 17 and the column decoder 15 in accordance with the level of the output signal of the AND circuit 21. During the data reading operation, the clock generator 22 controls the output buffer 25 to output data DO, which is read from the memory cell array 11.

The address buffer pre-decoder 17 receives the address signal AD in accordance with the control signal from the clock generator 20 and sends a predecode signal PRA to the row decoder 12. Further, the address buffer pre-decoder 17 receives the address signal AD in accordance with the control signal from the clock generator 22 and sends a predecode signal PRA to the column decoder 15. The column decoder 15 decodes the predecode signal PCA from the address buffer pre-decoder 17 to a selection signal and selects the predetermined bit line pairs BL0, /BL0 to BLn, /BLn of the memory cell array 11.

The write clock generator 23 receives a signal from the clock generator 22 and a reading signal /WE from an external device and controls the data input buffer 24 so that the data input buffer 24 receives the write signal DI during the write operation.

FIG. 2 is a circuit diagram showing the memory cell array 11, the sense amplifiers 13, and the sense amplifier driving circuit 16 in detail. The memory cell array 11 is also provided with the word lines WL0 to WLm (only lines WL0, WL1, WLm−1, WLm are shown in FIG. 2) and the pairs of the bit lines BL0, /BL0 to BLn, /BLn (only BL0, /BL0, BLn, /BLn are shown). The potential at the bit line pairs BL0, /BL0 to BLn, /BLn is set at one half of the internal power supply VDD voltage. During selection of memory C, an NMOS transistor 45 is deactivated in response to a low first precharge signal BRS and disconnected from the bit line pairs BL0, /BL0 to BLn, /BLn. Furthermore, NMOS transistors 46, 47 are deactivated to complete precharging of the bit line pairs BL0, /BL0 to BLn, /BLn and complete data write/read preparation.

The bit line pairs BL0, /BL0 to BLn, /BLn are connected to the sensor amplifier 13 via the transmission gate 31. The transmission gate 31 includes NMOS transistors 31A, each of which is connected to one of the bit lines BL0, /BL0 to BLn, /BLn. A high transmission control signal BT is sent to the gate of each NMOS transistor 31A. The transmission control signal BT is generated in accordance with the pull-up voltage BT and has the same voltage as the pull-up voltage BT. Accordingly, a high transmission control signal BT activates all of the NMOS transistors 31A and connects the memory cell array 11 to the sense amplifiers 13 and the I/O gate 14.

Each sense amplifier 13 forms a latch circuit that includes a first inverter 13a and a second inverter 13b. The first inverter 13a has a PMOS transistor 40 and an NMOS transistor 41 which are connected in series between high potential and low potential power supply lines PSA, NSA. The second inverter 13b has a PMOS transistor 42 and an NMOS transistor 43 which are connected in series between high potential and low potential power supply lines PSA, NSA. The PMOS and NMOS transistors 40, 41 have gates that are connected to the output terminal of the second inverter 13b and the inverted side of the bit lines /BL0–/BLn. The PMOS and NMOS transistors 42, 43 have gates that are connected to the output terminal of the first inverter 13a and the non-inverted side of the bit lines BL0 to BLn.

The sense amplifier driving circuit 16 is connected to the high potential and low potential power supply lines PSA, NSA to activate the sense amplifiers 13. The sense amplifier driving circuit 16 has a PMOS transistor 50, NMOS transistors 51, 52, and an inverter 53. The PMOS and NMOS transistors 50, 51, 52 are connected in series between the internal potential power supply VDD and the low potential power supply VSS. The PMOS transistor 50 has a source connected to the internal power supply VDD and a drain connected to the high potential power supply line PSA. The NMOS transistor 51 has a source connected to the high potential power supply line PSA and a drain connected to the low potential power supply line NSA. The NMOS transistor 52 has a source connected to the low potential power supply VSS and a drain connected to the low potential power supply line NSA. The PMOS transistor 50 and the NMOS transistor 51 have gates for receiving a signal /LE, which is the activation signal LE inverted, via the inverter 53. The NMOS transistor 52 has a gate for receiving the activation signal LE. The activation signal LE is high for a predetermined period when the row decoder 12 selects one of the word lines WL0 to WLm and selects a memory cell C. The activation signal LE remains low when none of the word lines WL0 to WLm are selected and none of the memory cells C are selected.

Accordingly, during memory selection, in response to a high activation signal LE, the PMOS and NMOS transistors 50, 52 are activated and the NMOS transistor 51 is deactivated. The high potential power supply line PSA is connected to the internal power supply VDD in response to the activation of the PMOS transistor 50. The low potential power supply line NSA is connected to the low power supply VSS in response to the activation of the NMOS transistor 52. The difference between the high potential power supply line PSA and the low potential power supply line NSA activates the sense amplifiers 13. In accordance with the levels of the high potential and low potential power supply lines PSA, NSA, each of the sense amplifiers 13 amplify the data of the corresponding bit line pairs BL0, /BL0 to BLn, /BLn and retains the amplified data.

When the memory cell is not selected, in response to a low activation signal LE, the PMOS and NMOS transistors 50, 52 are deactivated and the NMOS transistor 51 is activated. The high potential power supply line PSA is disconnected from the internal power supply VDD in response to the deactivation of the PMOS transistor 50. The low potential power supply line NSA is disconnected from the low power supply VSS in response to the deactivation of the NMOS transistor 52. In this state, the high potential and low potential power supply lines PSA, NSA are short circuited by the NMOS transistor 51. Since the high potential and low potential power supply lines PSA, NSA have levels that are one half of the internal power supply VDD voltage, the potential difference between the power supply lines PSA, NSA becomes null. This deactivates each of the sense amplifiers 13.

The operation of the DRAM 10 will now be described.

With reference to FIG. 3, if the external power supply VCC voltage is at the voltage VCCn, which is the value when in the normal state, the DRAM 10 is set in a normal operation mode. In this state, the internal power supply VDD voltage is set at the voltage VDDn and the reference power supplies VPR, VPD voltages are both set at a value represented by VDD/2.

[Read Operation Mode]

With reference to FIG. 1, when the DRAM 10 receives a high write control signal /WE, the DRAM 10 enters the read operation mode. When the row signal /RAS is high, the first precharge signal BRS is high. Accordingly, the precharge circuit 30 is activated causing the potential at the bit line pairs BL0, /BL0 to BLn, /BLn to be VDDn/2. In this state, since the activation signal LE is low, the sense amplifier driving circuit 16 is deactivated thereby causing the voltages at the high potential and low potential power supply lines PSA, NSA to be VDDn/2.

When the row signal /RAS falls, the first precharge signal BRS becomes low. This deactivates the precharge circuit 30 and disconnects the pairs of bit lines BL0, /BL0 to BLn, /BLn.

When the row signal /RAS falls, the address signal AD is sent to the address buffer pre-decoder 17 and decoded into a predecode signal PRA. When the column signal /CAS falls, the address signal AD is sent to the address buffer precharge decoder 17 and decoded into a predecode signal PCA.

The predecode signal PRA is decoded into a first selection signal by the row decoder 12. A predetermined word line WL0 to WLm is selected in accordance with the first selection signal. The predecode signal PCA is decoded into a second selection signal by the column decoder 15. A predetermined bit line pair BL0, /BL0 to BLn, /BLn is selected in accordance with the second selection signal. The data of the memory cell C connected to the selected word line WL0 to WLm and bit line pair BL0, /BL0 to BLn, /BLn is read out to the associated bit line BL0, /BL0 to BLn, /BLn. The read data is transmitted to the corresponding sense amplifier 13 via the transmission gate 31.

In response to a high activation signal LE, the sense amplifier driving circuit 16 is activated, the high potential power supply line PSA voltage is set at the voltage VDDn of the internal power supply VDD, and the low potential power supply line NSA is set at the low potential power supply VSS voltage (ground potential). Each sense amplifier 13 is activated in accordance with the high potential and low potential power supply lines PSA, NSA. The sense amplifiers 13 amplify the data of the associated bit line pair BL0, /BL0 to BLn, /BLn and retain the amplified data. The amplified data is transmitted to the data output buffer 25 via the I/O gate 14.

The transmitted data is output by the data output buffer 25 as read data DO in response to the output control signal /OE.

[Write Operation Mode]

When the DRAM 10 receives a low write control signal /WE, the DRAM 10 enters the write operation mode. When the row signal /RAS is high, the first precharge signal BRS is high and the level at the bit line pairs BL0, /BL0 to BLn, /BLn is VDDn/2. In this state, since the activation signal LE is low, the sense amplifier driving circuit 16 is deactivated thereby causing the voltage at the low potential and high potential power supply lines PSA, NSA to be VDDn/2.

When the row signal /RAS falls, the first precharge signal BRS becomes low. This deactivates the precharge circuit 30 and disconnects the pairs of bit lines BL0, /BL0 to BLn, /BLn.

When the row signal /RAS falls, the address signal AD is sent to the address buffer pre-decoder 17 and decoded into the predecode signal PRA. When the column signal /CAS falls, the address signal AD is sent to the address buffer precharge decoder 17 and decoded into the predecode signal PCA.

The predecode signal PRA is decoded into a first selection signal by the row decoder 12. A predetermined word line WL0 to WLm is selected in accordance with the first selection signal. The predecode signal PCA is decoded into a second selection signal by the column decoder 15. A predetermined bit line pair BL0, /BL0 to BLn, /BLn is selected in accordance with the second selection signal.

In response to the write control signal /WE, a write signal DI is sent to the data input buffer 24. The write signal DI is transmitted to the memory cell array 11 via the I/O gate 14 and the transmission gate 31. The write signal DI is then written to the memory cell C connected to the selected word line WL0 to WLm and the selected pairs of bit lines BL0, /BL0 to BLn, /BLn.

[Refresh Mode]

The DRAM 10 enters the refresh mode when only the row signal /RAS falls or when the row signal /RAS falls after the column signal /CAS falls.

When the row signal /RAS is high, the first precharge signal BRS is high. Accordingly, the precharge circuit 30 is activated causing the level at the bit line pairs BL0, /BL0 to BLn, /BLn to be VDDn/2. In this state, since the activation signal LE is low, the sense amplifier driving circuit 16 is deactivated thereby causing the high potential and low potential power supply line PSA, NSA voltages to be VDDn/2.

When the row signal /RAS falls, the first precharge signal BRS becomes low. This deactivates the precharge circuit 30 and disconnects the pairs of bit lines BL0, /BL0 to BLn, /BLn.

When the row signal /RAS falls, the address signal AD is sent to the address buffer pre-decoder 17 and decoded into a predecode signal PRA. The predecode signal PRA is decoded into a first selection signal by the row decoder 12. A predetermined word line WL0 to WLm is selected in accordance with the first selection signal. All of the data of the memory cells C connected to the selected word line WL0 to WLm and bit line pair BL0, /BL0 to BLn, /BLn is read out to each of the bit lines BL0, /BL0 to BLn, /BLn. The read data from the selected memory cells C is transmitted to the corresponding sense amplifier 13 via the transmission gate 31.

In response to a high activation signal LE, the sense amplifier driving circuit 16 is activated, the high potential power supply line PSA voltage is set at the voltage VDDn, and the low potential power supply line NSA is set at the low potential power supply VSS voltage (ground potential). Each sense amplifier 13 is activated in accordance with the high potential and low potential power supply lines PSA, NSA. The sense amplifiers 13 amplify the data of the associated bit line pair BL0, /BL0 to BLn, /BLn. The amplified data is transmitted via the bit line pairs BL0, /BL0 to BLn, /BLn and written on the corresponding memory cells C. This completes the refreshing of a single line.

In the refresh mode, a different word line WL0 to WLm is selected each time the row signal /RAS falls. The data on all of the memory cells connected to the selected word line WL0 to WLm is refreshed.

[Retention Mode]

With reference to FIG. 3, if the high potential power supply VCC is bumped down when the DRAM 10 is in a standby state, the DRAM 10 enters a retention mode. During the retention mode, only refreshing of the memory cell array 11 is performed. The refreshing of the memory cell array 11 is performed in the same manner as when in the normal operation mode.

In the DRAM 10, the sense amplifiers 13 are designed so that they are operated based on the reference power supply VPR voltage and so that if the reference power supply VPR voltage is equal to the sense amplifier power supply (i.e., one half of the internal power supply VDD voltage), the sense amplifiers 13 perform amplifying in a satisfactory manner.

However, the DRAM 10 generates the reference power supplies VPR, VPD when the internal power supply VDD is pulled down and sends the reference power supplies VPR, VPD via wires to the memory cell array 11. Thus, the reference power supply VPR voltage is not accurately set at one half the voltage of the internal power supply VDD. If the cell data is amplified and the voltage between the pairs of bit lines BL, /BL is maximized, the accurate value of the reference power supply VPR voltage is (VBL1+VBL2)/2.

In this manner, if the reference power supply VPR voltage is offset from a value that is one half the internal power supply VDD voltage, the reading characteristic of the sense amplifiers 13 is degraded. If the reference power supply VPR voltage is higher than a predetermined range that includes the value corresponding to one half the internal power supply VDD voltage, the data stored in the memory cell C may be destroyed.

For example, if the memory cell array 11 is refreshed immediately after the DRAM 10 enters the retention mode, the data stored in the memory cell C may be destroyed.

In other words, when the DRAM 10 is in the retention mode, if the external power supply VCC voltage decreases, the internal power supply VDD voltage decreases accordingly so that the voltage VDDr of the internal power supply VDD becomes equal to the voltage VCCr of the external power supply VCC. Hence, the reference voltage of the sense amplifiers 13 is set at VDDr/2.

The reference power supplies VPR, VPD are generated by pulling down the internal power supply VDD with the reference potential generator 29. The driving force of the reference potential generator 29 is low, and the parasitic capacitance of the sense amplifiers 13 and the pairs of bit lines BL0, /BL0 to BLn, /BLn is large for the power supply VPR. Thus, the reference power supply VPR, VPD voltages do not decrease in accordance with the voltage decrease of the external power supply and gradually decrease to VDDr/2 at a predetermined rate (several hundred microseconds). Accordingly, during this period, the reference power supply VPR, VPD voltages are set at a value greater than the reference voltages VDDr/2 of the sense amplifiers 13. Hence, if the memory cell array 11 is refreshed before the reference power supply VPR voltage reaches VDDr/2, the data stored in the memory cells C may be destroyed.

To overcome this problem, a DRAM or a DRAM controller can be provided with a timer. When the DRAM enters the retention mode, the timer measures the time until the reference power supply VPR, VPD voltages become one half the voltage of the internal power supply VDD and the issuance of a refresh command during that period is prohibited.

However, in the DRAM 10 provided with the retention mode, for example, the change from the normal operation of the internal power supply VDD (VDDn=2.5V) to the retention mode (VDDr=1.5V) is relatively large. Further, the operational ambient temperature of the DRAM 10 and the controller is between 0° C. to 75° C. Thus, the production of a highly accurate timer for measuring several hundred microseconds on the semiconductor device is impossible. Further, such a timer is a complicated analog circuit that occupies a large circuit area. Accordingly, the circuit area of the semiconductor device increases. This, in turn, increases production costs.

Furthermore, in the retention mode, a standby time of several hundred microseconds before commencing refreshing is relatively long in comparison to the data retention time of several milliseconds. Thus, refreshing must be performed in a concentrated manner just before entering the retention mode to retain the data of the DRAM 10 in the retention mode. This increases the current consumption of the DRAM 10 and complicates the control of the DRAM 10.

In the normal operation mode of the DRAM 10, a reference potential need not be applied to the selected bit line pairs BL0, /BL0 to BLn, /BLn to perform the write operation. In this case, only a potential difference in the write signal, which is applied to the selected bit line pairs BL0, /BL0 to BLn, BLn, need occur. In the write operation, the precharge circuit 30 is activated each time data is written. This precharges the pairs of bit lines BL0, /BL0 to BLn, /BLn in accordance with the reference power supply VPR and causes the potentials of each bit line pair BL0, /BL0 to BLn, /BLn to be equal to each other. As described above, the drive power of the reference potential generator 29 is low, and the reference power supplies VPR, VPD are sent to the entire memory cell array 11. Thus, when the pairs of bit lines BL0, /BL0 to BLn, /BLn are precharged after the data is written, the voltage of the reference power supply VPR becomes one half the total of the voltages of pairs of bit lines BL0, /BL0 to BLn, /BLn. Accordingly, if the write operation is performed consecutively for N times, the voltage of the write signal of the pairs of bit lines BL0, /BL0 to BLn, /BLn subsequent to the precharging may be offset greatly from the reference voltage VDDn/2 of the sense amplifiers 13.

Therefore, if the read operation is performed immediately after the write operation is performed consecutively for N times, the sense amplifiers 13 may not function properly and may thus destroy the data of the selected memory cell C.

SUMMARY OF THE INVENTION

Accordingly, it is an object of the present invention to provide a semiconductor memory device that retains the data of the memory cell properly.

To achieve the above object, the present invention provides a semiconductor memory device including a plurality of memory cells and a plurality of bit line pairs connected to the memory cells. Each bit line pair includes a first bit line and a second bit line. A precharge circuit is connected to the bit line pairs to selectively provide the bit line pairs with a reference power supply voltage. The precharge circuit stops providing the bit line pairs with the reference power supply voltage when the memory cells are accessed to transmit a data signal to one of the memory cells via a corresponding one of the bit line pairs, and provides the bit line pairs with the reference power supply voltage as a precharge voltage when the memory cells are not being accessed. A correction circuit adjusts the precharge voltage in accordance with a difference between the precharge voltage of the bit line pairs and the reference power supply voltage so that the precharge voltage of the bit line pairs becomes substantially equal to the reference power supply voltage.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 9(a) to 9(i) are timing charts showing the operation of the DRAM of FIG. 6;

FIG. 10 is a block diagram showing a DRAM according to a second embodiment of the present invention;

FIGS. 16(a) to 16(h) are timing charts showing the operation of the DRAM of FIG. 13.

DETAILED DESCRIPTION OF THE PREFERRED EMBODIMENTS

[First Embodiment]

Figure 1:
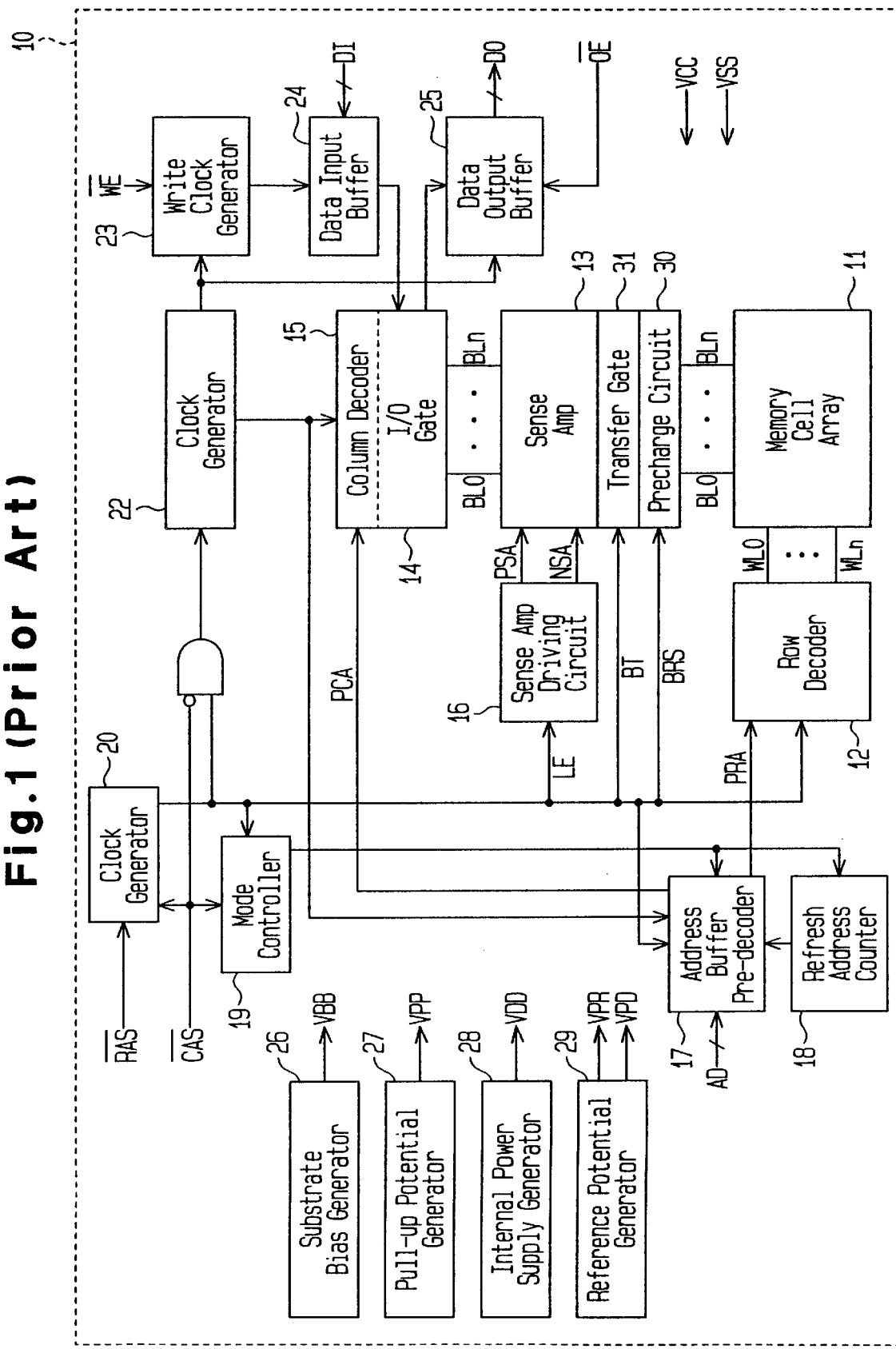
FIG. 1 is a block diagram showing a prior art DRAM.
Figure 2:
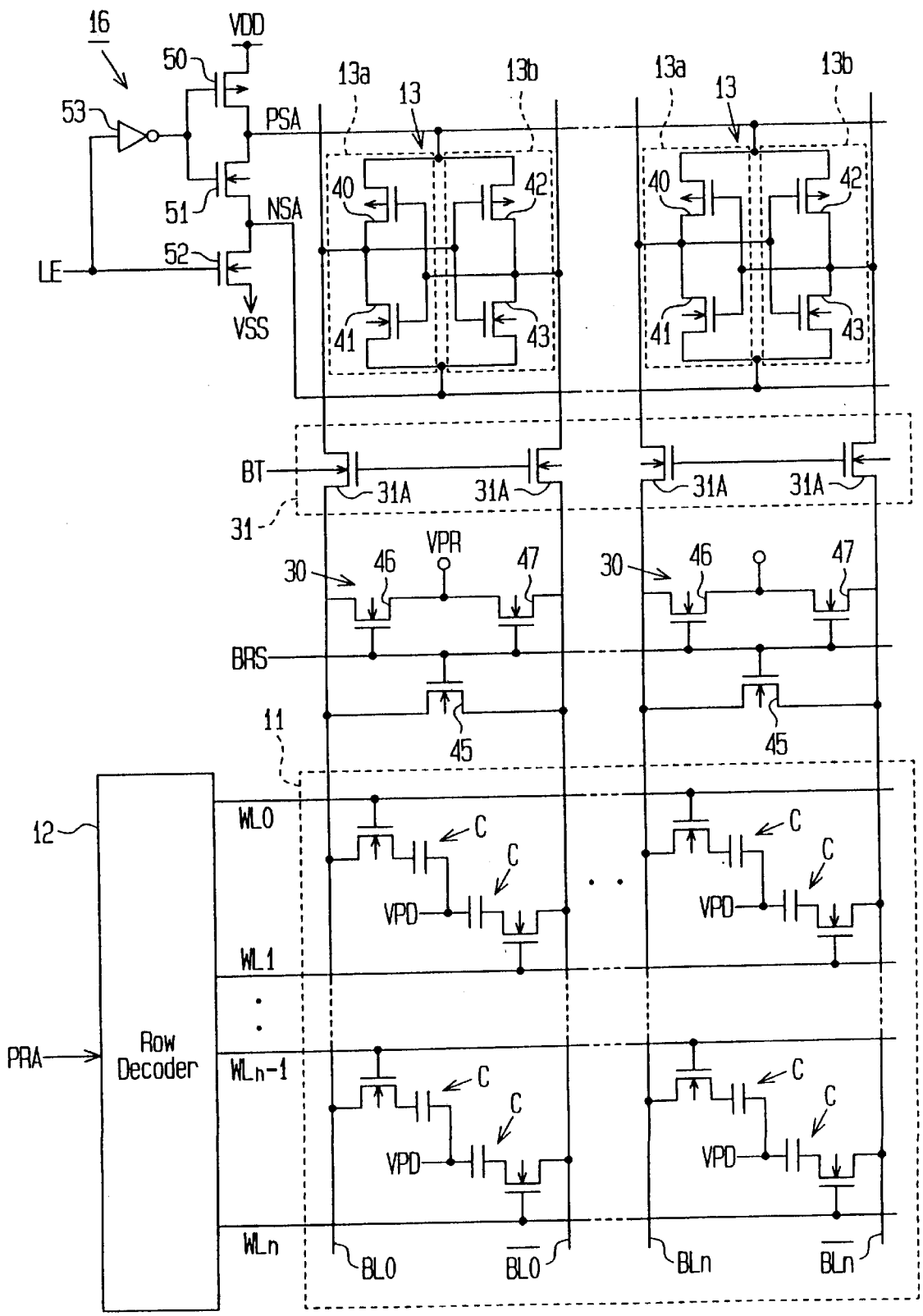
FIG. 2 is a circuit diagram showing a memory cell array of the DRAM of FIG. 1.
Figure 3:
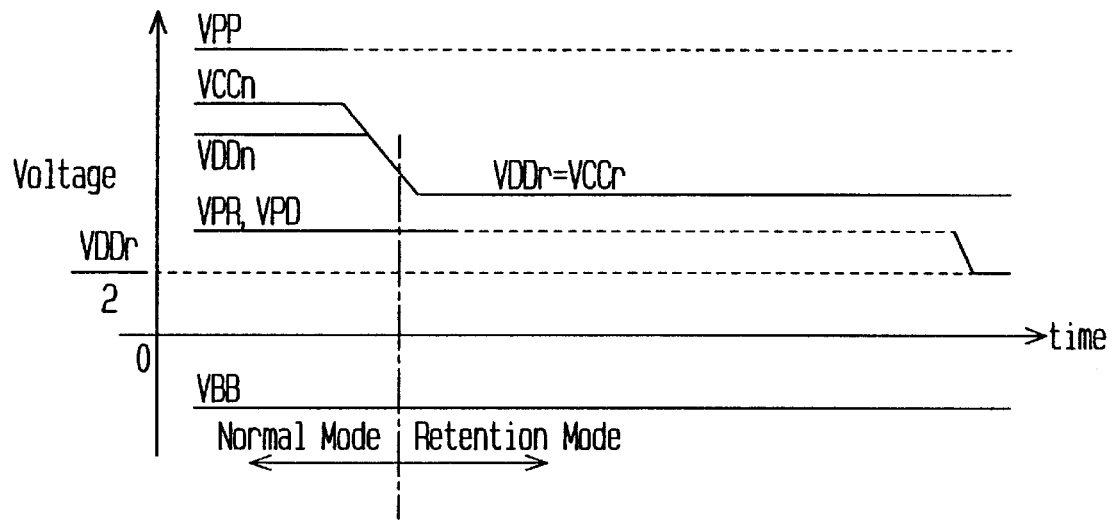
FIG. 3 is a timing chart showing changes in each power supply voltage of the DRAM of FIG. 1.
Figure 4:
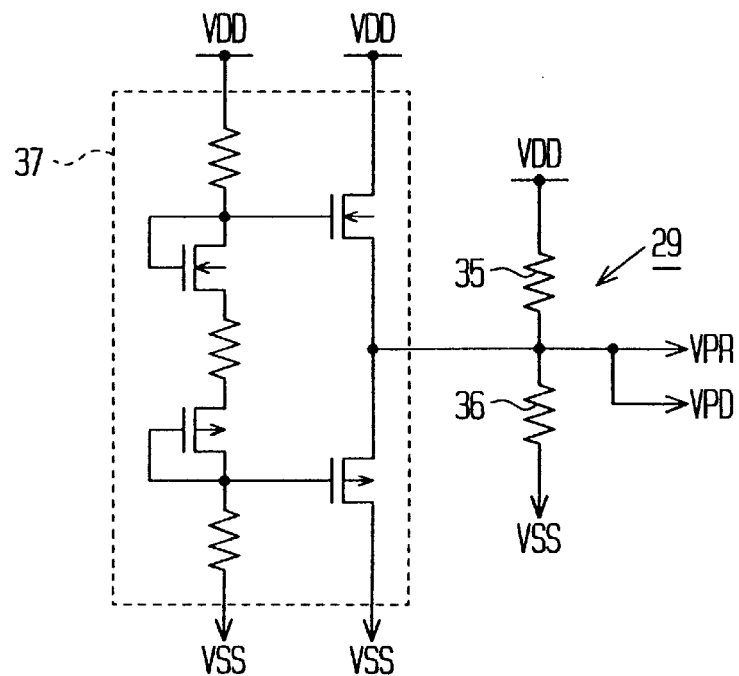
FIG. 4 is a circuit diagram showing a reference potential generator of the DRAM of FIG. 1.
Figure 5:
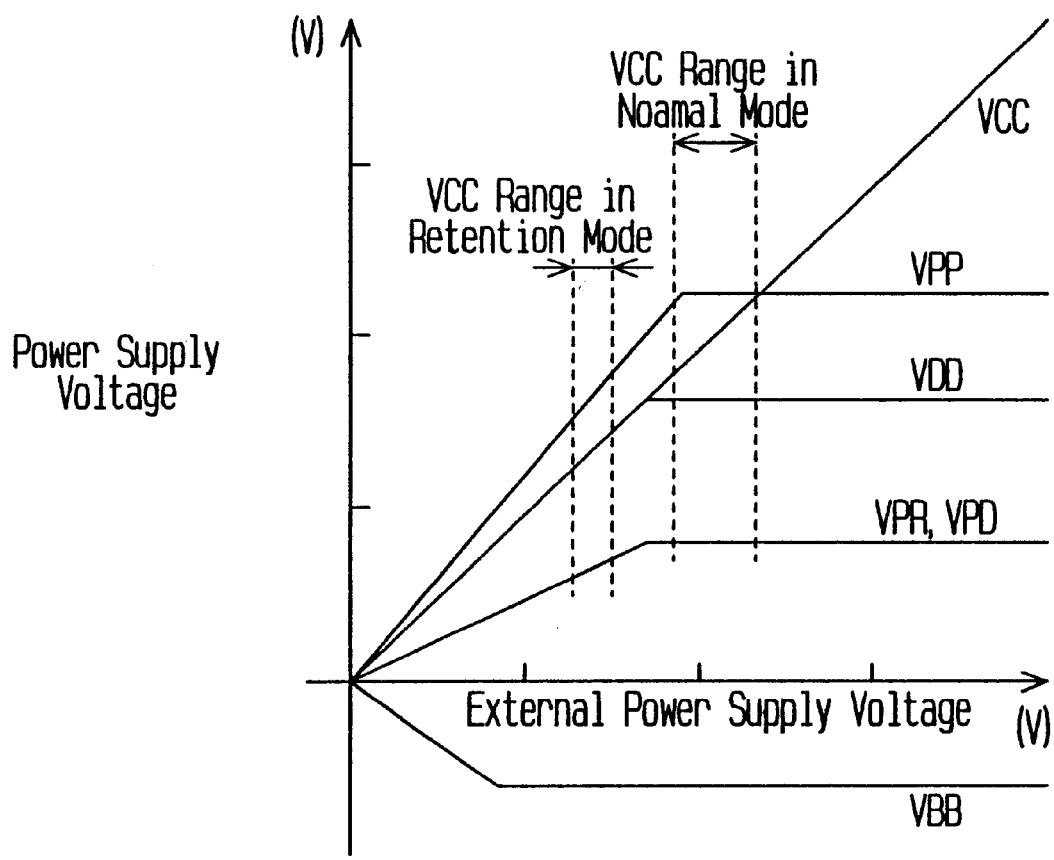
FIG. 5 is a graph showing the relationship between the external power supply voltage of the DRAM of FIG. 1 and each power supply voltage.
Figure 6:
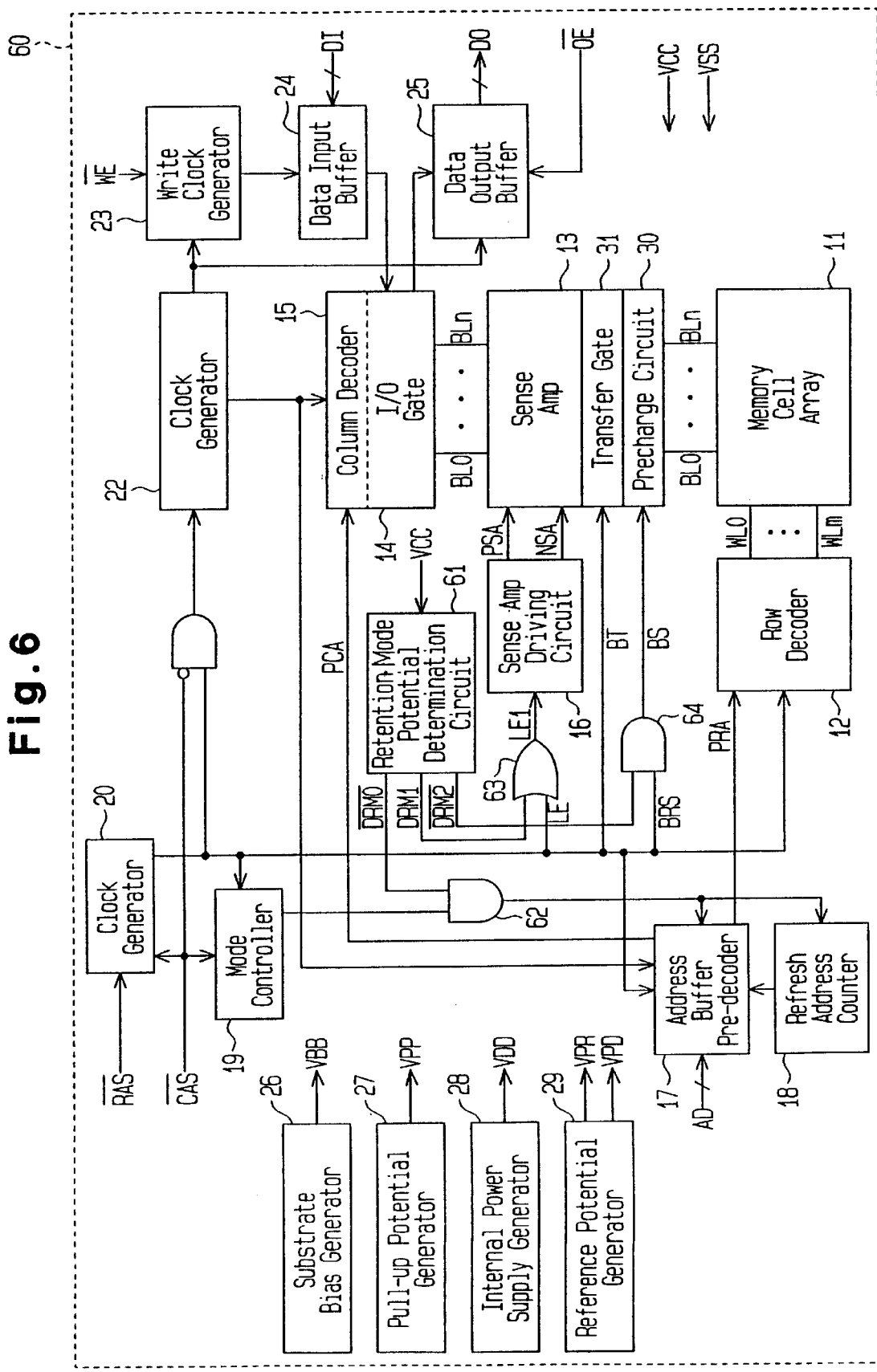
FIG. 6 is a block diagram showing a DRAM according to a first embodiment of the present invention.
Figure 7:
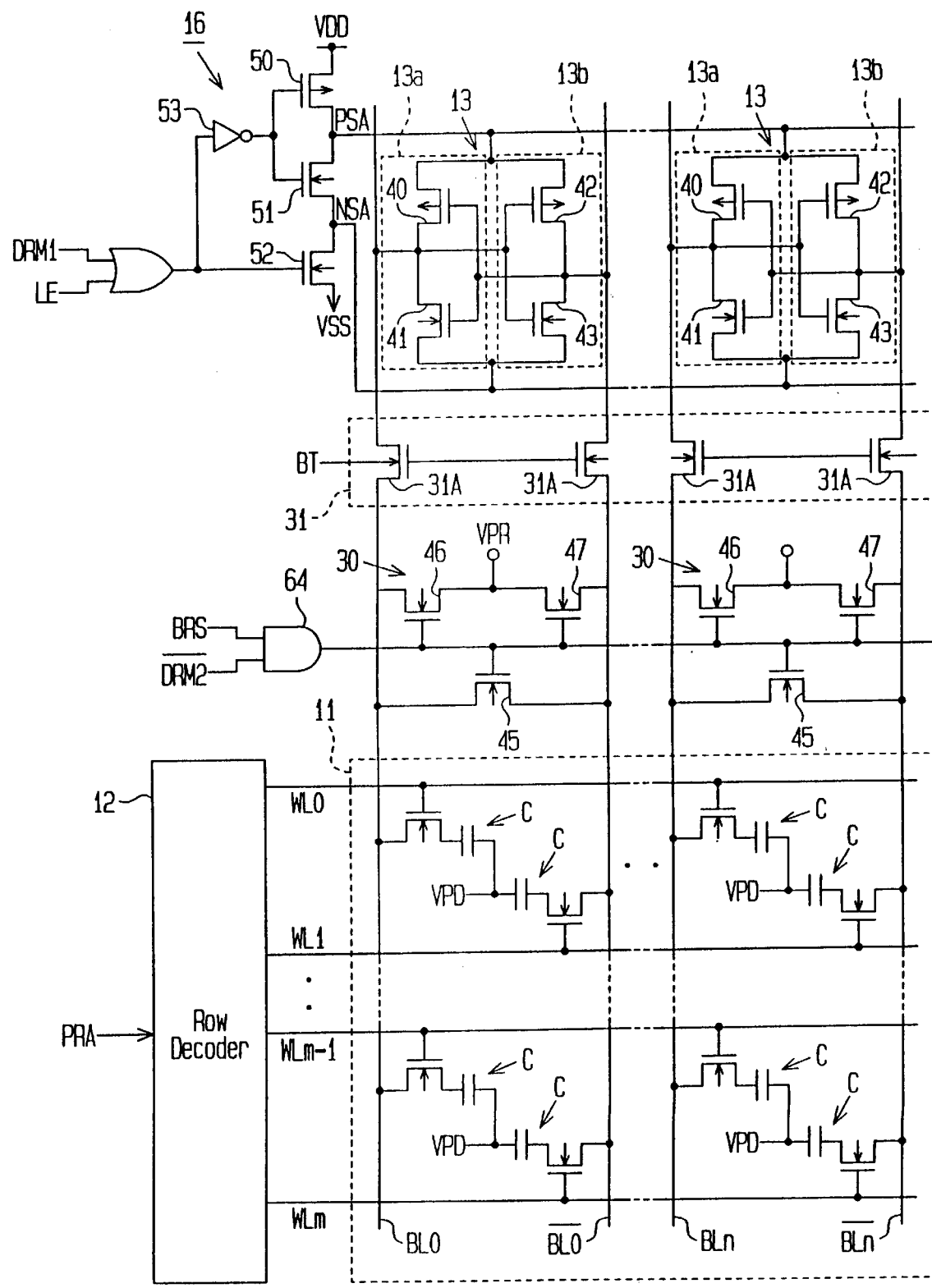
FIG. 7 is a circuit diagram showing a memory cell array of the DRAM of FIG. 6.

A DRAM according to a first embodiment of the present invention will now be described with reference to FIGS. 6 to 9. In FIGS. 6 and 7, like or same reference numerals are given to those components that are the same as the corresponding components of FIGS. 1 and 2. Such components are not described.

As shown in FIG. 6, a DRAM 60 of the first embodiment differs from the prior art DRAM 10 in that the DRAM 60 includes a retention mode potential determination circuit 61, a first AND circuit 62, an OR circuit 63, and a second AND circuit 64.

The retention mode potential determination circuit 61 receives a high potential power supply VCC and generates control signals /DRM0, DRM1, /DRM2. The AND circuit 62 has two input terminals, one for receiving a control signal from the mode controller 19 and one for receiving the control signal /DRM0 from the retention mode potential determination circuit 61, and an output terminal connected to the address buffer pre-decoder 17 and the refresh address counter 18. The OR circuit 63 has two input terminals, one for receiving a control signal from the first clock generator 20 and one for receiving the control signal DRM1 from the retention mode potential determination circuit 61, and an output terminal for sending a control signal LE1 to the sense amplifier driving circuit 16. The AND circuit 64 has two input terminals, one for receiving the first precharge signal BRS and one for receiving the control signal /DRM2 from the retention mode potential determination circuit 61, and an output terminal for sending the second precharge signal BS to the precharge circuit 30.

The retention mode potential determination circuit 61, the AND circuit 62, the OR circuit 63, the sense amplifiers 13, and the AND circuit 64 adjust the precharge voltage so that the precharge voltage of the bit line pairs BL0, /BL0 to BLn, /BLn is set at the reference power supply voltage VPR.

The sense amplifiers 13 function as a power supply. That is, when the sense amplifiers 13 are activated, the sense amplifiers 13 send the internal power supply VDD to one of the corresponding bit lines BL0 to BLn and the low potential power supply VSS to the other one of the bit lines /BL0 to /BLn.

Figure 8:
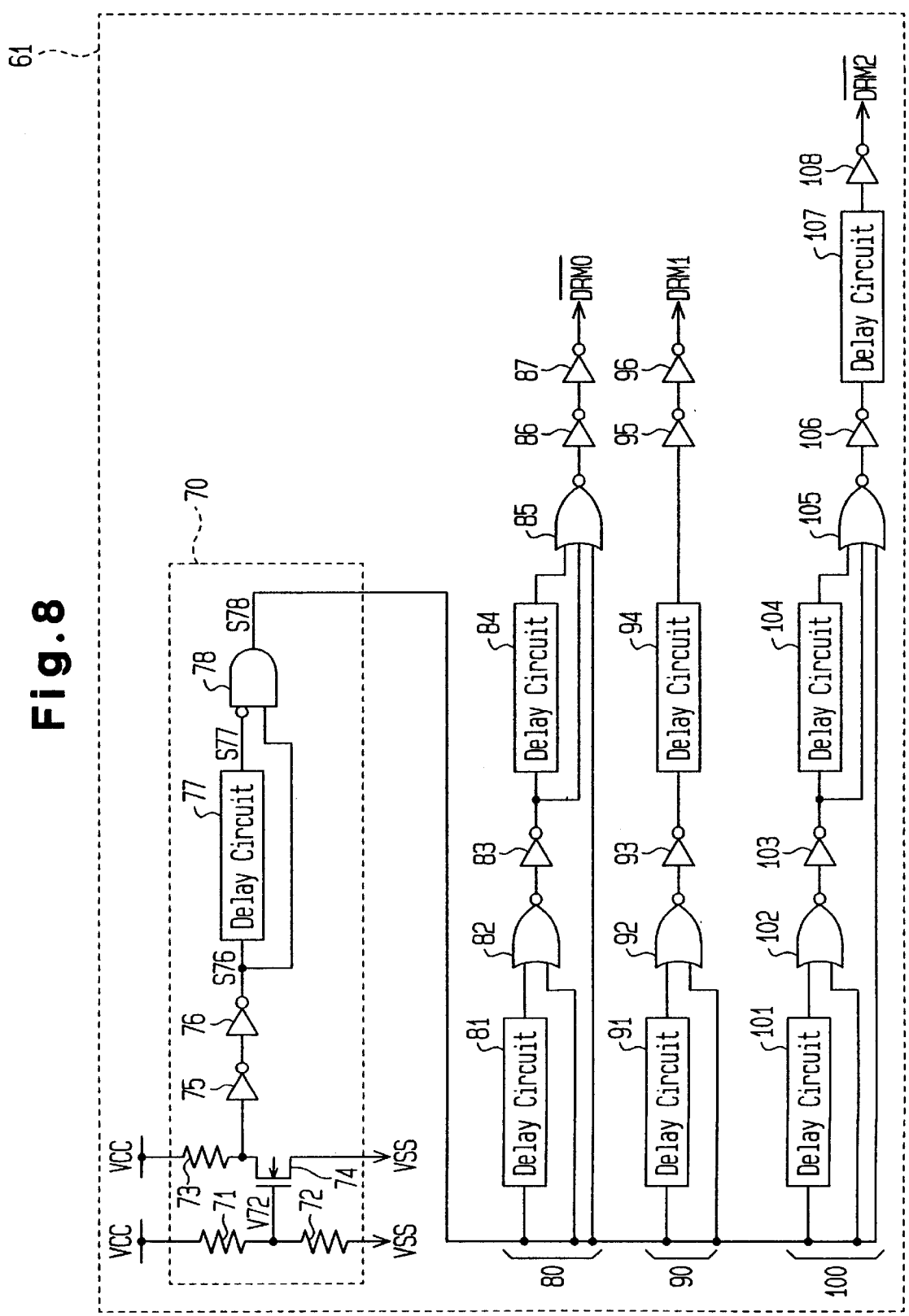
FIG. 8 is a circuit diagram showing a retention mode potential determining circuit of the DRAM of FIG. 6.

As shown in FIG. 8, the retention mode potential determination circuit 61 includes a voltage detection circuit 70, and first to third control signal generating circuits 80, 90, 100.

The voltage detection circuit 70 detects the high potential power supply VCC voltage in accordance with the levels of the high potential and low potential power supplies VCC, VSS. The voltage detection circuit 70 includes resistors 71–73, an NMOS transistor 74, inverters 75, 76, a delay circuit 77, and an AND circuit 78.

Two of the resistors 71, 72 are connected in series between the high potential and low potential power supplies VCC, VSS. A detection voltage V72 is generated at a node between the resistors 71, 72 by dividing the high potential power supply VCC voltage. The resistor 73 and the NMOS transistor 74 are connected in series between the high potential and low potential power supplies VCC, VSS. The NMOS transistor 74 has a gate which receives the detection voltage V72.

If the detection voltage V72 is lower than a threshold value Vth of the NMOS transistor 74, the NMOS transistor 74 is deactivated and a high detection signal is generated at a node (the drain of the NMOS transistor 74) between the resistor 73 and the NMOS transistor 74.

The inverters 75, 76 are connected in series to the drain of the NMOS transistor 74. The output terminal of the inverter 76 is connected to the delay circuit 77. The AND circuit 78 has a inverted input terminal connected to the output terminal of the delay circuit 77 and a non-inverted input terminal connected to the output terminal of the inverter 76.

If the high potential power supply VCC voltage connected to the DRAM 60 is at voltage VCCn, which is the voltage in a normal state, as shown in FIG. 9(a), the detection voltage V72 is higher than the threshold voltage Vth of the NMOS transistor 74. Accordingly, the NMOS transistor 74 is activated and a low signal is sent to the inverter. As a result, the inverter 76 generates a low output signal S76, and the AND circuit 78 generates a low output signal S78.

When the DRAM 60 enters the retention mode, the high potential power supply VCC is bumped down to voltage VCCr, which is the voltage during the retention mode, and the detection voltage V72 becomes lower than the threshold voltage Vth of the NMOS transistor 74. This deactivates the NMOS transistor 74 and the inverter 75 receives a high signal. Thus, the inverter 76 generates a high output signal S76. In this state, the output signal of the delay circuit 77 rises after a delay of a predetermined time from the rising of the output signal S76 of the inverter 76. Thus, as shown in FIG. 9(d), a single positive pulse is generated at the output signal S78 of the AND circuit 78. The retention mode of the DRAM 60 is detected from this pulse signal.

Returning to FIG. 8, the first control signal generating circuit 80 generates the control signal /DRM0 to deactivate the address pre-decoder 17 and the refresh address counter 18 in accordance with the detection result of the retention mode by the voltage detection circuit 70.

The first control signal generating circuit includes two delay circuits 81, 84, two NOR circuits 82, 85, and inverters 83, 86, 87. The delay circuit 81 is connected to the output terminal of the voltage detection circuit 70. The NOR circuit 82 has a first input terminal connected to the output terminal of the delay circuit 81, a second input terminal connected to the output terminal of the voltage detection circuit 70, and an output terminal connected to the inverter 83. The NOR circuit 85 has a first input terminal connected to the output terminal of the voltage detection circuit 70, a second input terminal connected to the output terminal of the inverter 83, a third input terminal connected to the output terminal of the delay circuit 84, and an output terminal connected to the input terminal of the inverter 86.

As shown in FIGS. 9(d) and 9(e), when a positive pulse is generated in the output signal S78, a negative pulse having a pulse width that is longer than the output signal S78 is generated in the control signal /DRM0 from the inverter 87 in synchronism with the rising of the output signal S78.

Referring to FIG. 8 again, the second control signal generating circuit 90 generates the control signal DRM1 to activate the sense amplifier driving circuit 16 in accordance with the detection result of the retention mode by the voltage detection circuit 70.

More specifically, the second control signal generating circuit 90 includes delay circuits 91, 94, a NOR circuit 92, and inverters 93, 95, 96, which correspond with the delay circuits 81, 84, the NOR circuit 82, and the inverters 83, 86, 87 of the first control signal generating circuit 80, respectively. The structure of the second control signal generating circuit 90 is the same as that of the first control signal generating circuit 80 except that the NOR circuit 85 is not included in the second control signal generating circuit 90.

As shown in FIGS. 9(d) and 9(f), when a positive pulse is generated in the output signal S78, a positive pulse having a pulse width that is longer than the output signal S78 is generated in the control signal DRM1 from the inverter 96 after the output signal S78 falls.

With reference to FIG. 8, the third control signal generating circuit 100 generates the control signal /DRM2 to activate the precharge circuit 30 in accordance with the detection result of the retention mode by the voltage detection circuit 70.

More specifically, the third control signal generating circuit 100 includes delay circuits 101, 104, NOR circuits 102, 105 and inverters 103, 106, 108, which correspond with the delay circuits 81, 84, the NOR circuits 82, 85 and the inverters 83, 86, 87 of the first control signal generating circuit 80, respectively. The third control signal generating circuit 100 further includes a delay circuit 107 connected between the inverters 106, 108.

As shown in FIGS. 9(d), 9(f) and 9(g), when a positive pulse is generated in the output signal S78, a negative pulse having a pulse width that is longer than the control signal /DRM1 is generated in the control signal /DRM2 from the inverter 108 after the output signal S78 falls.

With reference to FIG. 6, the AND circuit 62 deactivates the address buffer pre-decoder 17 and the refresh address counter 18 in response to the first control signal /DRM0. When the control signal /DRM0 is low, the AND circuit 62 inhibits the control signal sent from the mode controller 19 to the address buffer pre-decoder 17 and the refresh address counter 18 to deactivate the address buffer pre-decoder 17 and the refresh address counter 18.

The OR circuit 63 generates the control signal LE1 to activate the sense amplifier driving circuit 16 in response to the second control signal DRM1. The activation signal LE1 output by the OR circuit 63 is high as long as the control signal DRM1 is high (i.e., immediately after the DRAM 60 enters the retention mode) even if the deactivation signal LE is low. The high control signal LE1 activates the sense amplifier driving circuit 16 and operates the sense amplifiers 13.

The AND circuit 64 activates the precharge circuit 30 in response to the third control signal /DRM2. That is, the AND circuit 64 generates the second precharge signal BS to activate the precharge circuit 30 when the first precharge signal BRS and the control signal /DRM2 are both high. In other words, the precharge circuit 30 is activated when the DRAM 60 is in the retention mode, the memory cells C are not accessed, and after the sense amplifiers 13 are deactivated. This precharges the bit line pairs BL0, /BL0 to BLn, /BLn.

The operation of the DRAM 60 will now be described.

With reference to FIG. 9(a), the DRAM 60 enters the normal operation mode when the external power supply VCC voltage is at voltage VCCn, which is the value during normal operation. In the normal operation mode, the control signal generated by the mode controller 19 is sent in accordance with the row signal /RAS and the column signal /CAS to the address buffer pre-decoder 17 and the refresh address counter 18 via the AND circuit 62. The address buffer pre-decoder 17 and the refresh address counter 18 are operated in response to the control signal. Since the second control signal DRM1 is low during the normal operation mode, the OR circuit 63 sends the activation signal from the clock generator 20 to the sense amplifier driving circuit 16 as the activation signal LE1. The sense amplifier driving circuit 16 is activated in accordance with the level of the activation signal LE1. This permits amplifying to be carried out by each of the sense amplifiers 13. Furthermore, since the third control signal /DRM2 is high during the normal operation mode, the AND circuit 64 sends the first precharge signal BRS from the mode controller 19 to the precharge circuit 30 as the second precharge signal BS. The precharge circuit 30 is operated in accordance with the level of the second precharge signal BS.

As described above, the read, write, and refresh operations of the DRAM 60 are performed in the same manner as the DRAM 10.

With reference to FIG. 9(a), if the operation power supply VCC is bumped down by the controller (not shown) when the DRAM 60 is in a standby state, the DRAM 60 enters the retention mode. In the retention mode, only refreshing of the memory cell array 11 is performed.

When the external power supply VCC voltage decreases, the internal power supply VDD voltage decreases accordingly. Consequently, the voltage VDDr of the internal power supply VDD and the voltage VCCr of the external power supply VCC become equal to each other during the retention mode. The reference power supplies VPR, VPD are generated in accordance with the internal power supply VDD voltage. However, since the driving capability of the reference potential generator 29 is relatively low, the parasitic capacitance of the sense amplifiers 13 and all of the bit line pairs BL0, /BL0 to BLn, /BLn of the memory cell array 11 is large at the power supply VPR. Thus, the reference power supply VPR, VPD voltages do not decrease suddenly and are maintained at VDDn/2 for a predetermined time.

The detection voltage V72 of the retention mode potential determination circuit 61 decreases in accordance with the decrease in the external power supply VCC voltage. When the detection voltage V72 falls to a value less than the threshold value Vth of the NMOS transistor 74, the NMOS transistor 74 is deactivated and the output signal of the NMOS transistor 74 rises. Thus, the output signal S76 of the inverter 76 rises as shown in FIG. 9(b). Further, a positive pulse is generated in the output signal S78 as shown in FIG. 9(c). Thus, it is detected that the DRAM 60 has entered the retention mode.

In response to the rising of the output signal S78, the control signal generating circuit 80 generates the control signal /DRM0 with a negative pulse having a pulse width that is wider than the pulse width of the output signal S78. In response to the falling of the output signal S78, the control signal generating circuit 100 generates the control signal /DRM2 with a positive pulse having a pulse width that is narrower than the pulse width of the control signal /DRM0. In response to the positive pulse of the output signal S78 and after the pulse of the output signal S78 falls, the control signal generating circuit 90 generates the control signal DRM1 having a pulse width that is narrower than the pulse width of the control signal /DRM2.

The output of the AND circuit 62 is inhibited by the low control signal /DRM0. Accordingly, the control signal from the mode controller 19 is blocked by the AND circuit 62 and not sent to the address buffer pre-decoder 17 and the refresh address counter 18. Thus, the address buffer pre-decoder 17 and the refresh address counter 18 are deactivated and the predecode signal PRA is not generated from the address signal AD. Accordingly, none of the word lines WL0 to WLm nor the memory cells C are selected.

Subsequently, if the control signal /DRM2 falls, the second precharge signal BS goes low regardless of the level of the first precharge signal BRS. This ends the precharging of the bit line pairs BL0, /BL0 to BLn, /BLn. In this state, the precharge voltage of the bit line pairs BL0, /BL0 to BLn, /BLn is still maintained at VDDn/2 due to the parasitic capacitance of the reference power supply VPR (at the bit line pairs BL0, /BL0 to BLn, /BLn and the sense amplifiers 13).

Afterward, when the control signal DRM1 rises, the activation signal LE1 rises regardless of the level of the activation signal LE. The sense amplifier driving circuit 16 is activated in response to the activation signal LE1. The high potential power supply line PSA voltage is set at the voltage VDDr of the internal power supply VDD, and the low potential power supply line NSA voltage is set at the voltage (0V) of the low potential power supply VSS. As a result, each of the sense amplifiers 13 are activated. Thus, the internal pow supply VDD is sent to one of the bit line pairs BL0, /BL0 to BLn, /BLn corresponding to each sense amplifier 13, while the low potential power supply VSS is sent to the other one of the bit line pairs BL0, /BL0 to BLn, /BLn. This sets both of the bit lines BL0, /BL0 to BLn, /BLn at voltage VDDr or 0V. Since none of the memory cells C are selected in this state, the data of the memory cells C are prevented from being destroyed by the voltage at the bit line pairs BL0, /BL0 to BLn, /BLn. Thus, the data is retained properly.

With reference to FIG. 9(f), when the control signal DRM1 falls, the sense amplifier driving circuit 16 is deactivated. In this state, the high potential and low potential power supply lines PSA, NSA are short circuited by the NMOS transistor 51. Thus, the high potential and low potential power supply line PSA, NSA voltages are set at VDDr/2.

With reference to FIG. 9(g), when the control signal /DRM2 rises, the second precharge signal BS goes high since the first precharge signal BRS is high. In response to the high second precharge signal BS, the precharge circuit 30 is activated. This precharges the bit line pairs BL0, /BL0 to BLn, /BLn with the reference power supply VPR and the potentials at the bit line pairs BL0, /BL0 to BLn, /BLn become equal to one another. In this state, the parasitic capacitance of the reference power supplies VPR, VPD are large in comparison to the driving capability of the reference potential generator 29. Thus, the voltage of the bit line pairs BL0, /BL0 to BLn, /BLn is set at VDDr/2 and the voltage of the reference power supply VPR substantially follows the voltage alteration of the bit line pairs BL0, /BL0 to BLn, /BLn and is set at VDDr/2.

Accordingly, when the DRAM 60 is in the retention mode and the control signal /DRM0 is low, the address buffer pre-decoder 17 and the refresh address counter 18 are deactivated by the control signal /DRM0 even when the DRAM 60 receives a refresh command from the DRAM 60. Thus, the memory cells C of the memory cell array 11 are not refreshed. Furthermore, as shown in FIG. 9(e), the voltages of the bit line pairs BL0, /BL0 to BLn, /BLn have already been set at VDDr/2 when the control signal /DRM0 rises. Afterward, when the DRAM 60 receives a refresh command from the controller, the address pre-decoder 17 and the refresh address counter 18 are activated by a control signal from the mode controller 19 to perform normal refresh operation.

The first embodiment has the advantages described below.

The retention mode potential determination circuit 61 detects whether or not the DRAM 60 is in the retention mode by detecting a decrease in the external power supply VCC. Precharging of the bit line pairs BL0, /BL0 to BLn, /BLn is completed in accordance with the detection result without the word lines WL0 to WLm being selected. The sense amplifiers 13 are then supplied with the voltage VDDr of the internal power supply VDD in the retention mode in order to set the voltages at the bit line pairs BL0, /BL0 to BLn, /BLn at the voltage VDDr and the ground voltage. Afterward, the bit line pairs BL0, /BL0 to BLn, /BLn are precharged so that the voltages at the bit line pairs BL0, /BL0 to BLn, /BLn are set at VDDr/2. Due to the precharge, the voltage of the reference power supply VPR decreases to VDDr/2 at substantially the same timing as the voltages of the bit line pairs BL0, /BL0 to BLn, /BLn. Thus, the standby time from when the DRAM 60 enters the retention mode to when the refresh operation is started is decreased.

The DRAM 60 of the first embodiment is formed by adding the retention mode potential determination circuit 61, the AND circuits 62, 64, and the OR circuit 63 to the prior art DRAM 10. By using the conventional sense amplifiers 13 and the precharge circuit 30 that are connected to the memory cell array 11, the reference power supply VPR is set at a desired voltage immediately after the DRAM 60 enters the retention mode. Since the conventional circuit can be used, the time for designing the DRAM 60 is shortened. Furthermore, the circuit area of the semiconductor device need not be increased and production costs are saved.

[Second Embodiment]

Figure 12:
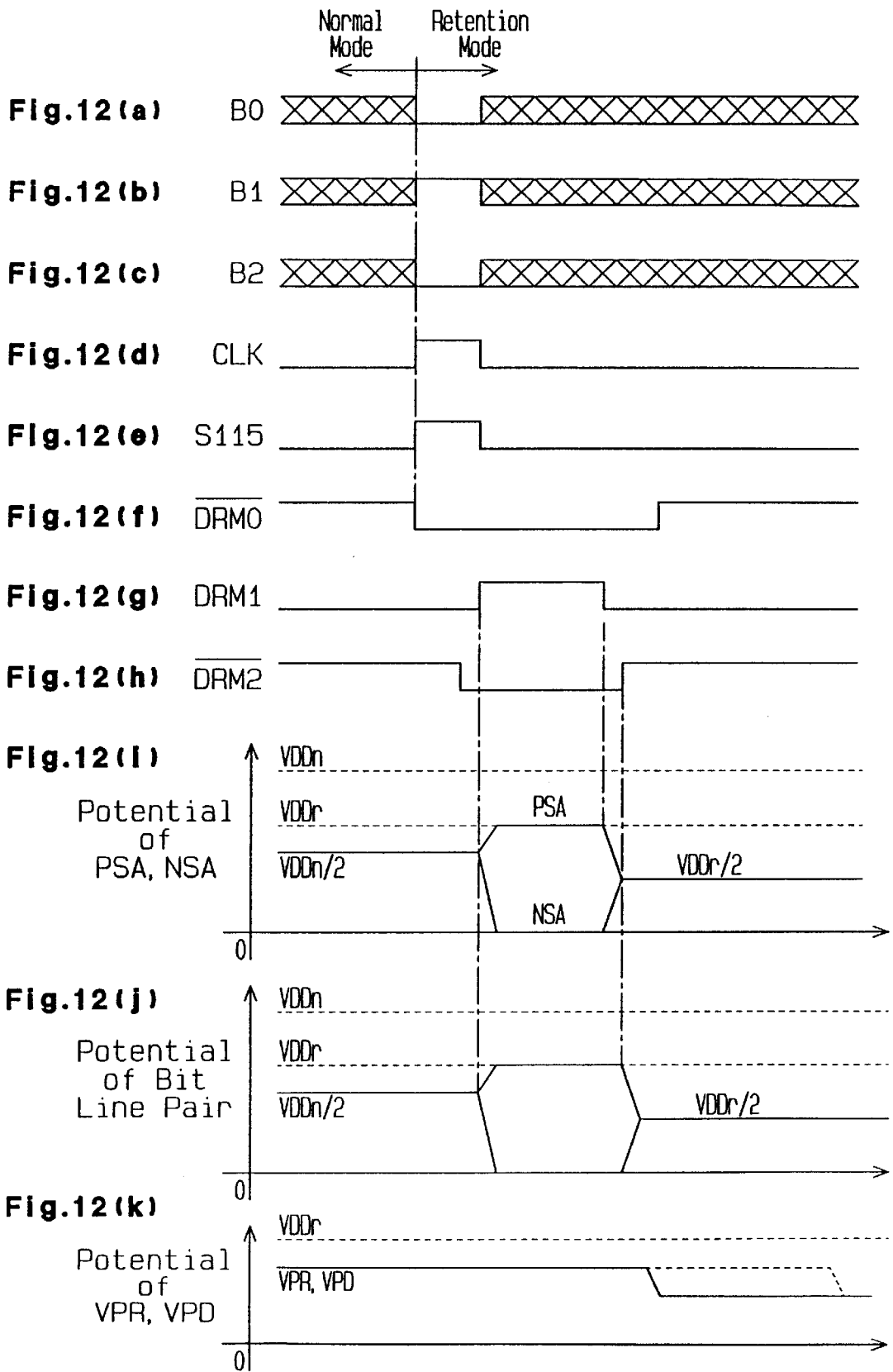
FIGS. 12(a) to 12(k) are timing charts showing the operation of the DRAM of FIG. 10.

With reference to FIGS. 10 and 12, a DRAM 110 according to a second embodiment of the present invention will now be described. The description will center on those parts that differ from the DRAM 60 of the first embodiment.

As shown in FIG. 10, the DRAM 110 of the second embodiment differs from the DRAM 60 of the first embodiment in that a retention mode command determination circuit 111 is provided.

The retention mode command determination circuit 111, the AND circuit 62, the OR circuit 63, the sense amplifiers 13, and the AND circuit 64 adjust the precharge voltage of the bit line pairs BL0, /BL0 to BLn, /BLn so that the precharge voltage becomes substantially equal to the reference power supply VPR voltage.

The retention mode command determination circuit 111 receives a retention mode command CMD, which indicates that the DRAM 110 is going to enter the retention mode, and a clock signal CLK from the controller (not shown). The retention mode command determination circuit 111 receives the retention mode command CMD just before the voltage of the external power supply VCC decreases. The retention mode command CMD preferably includes three bits of data B0, B1, B2.

Figure 11:
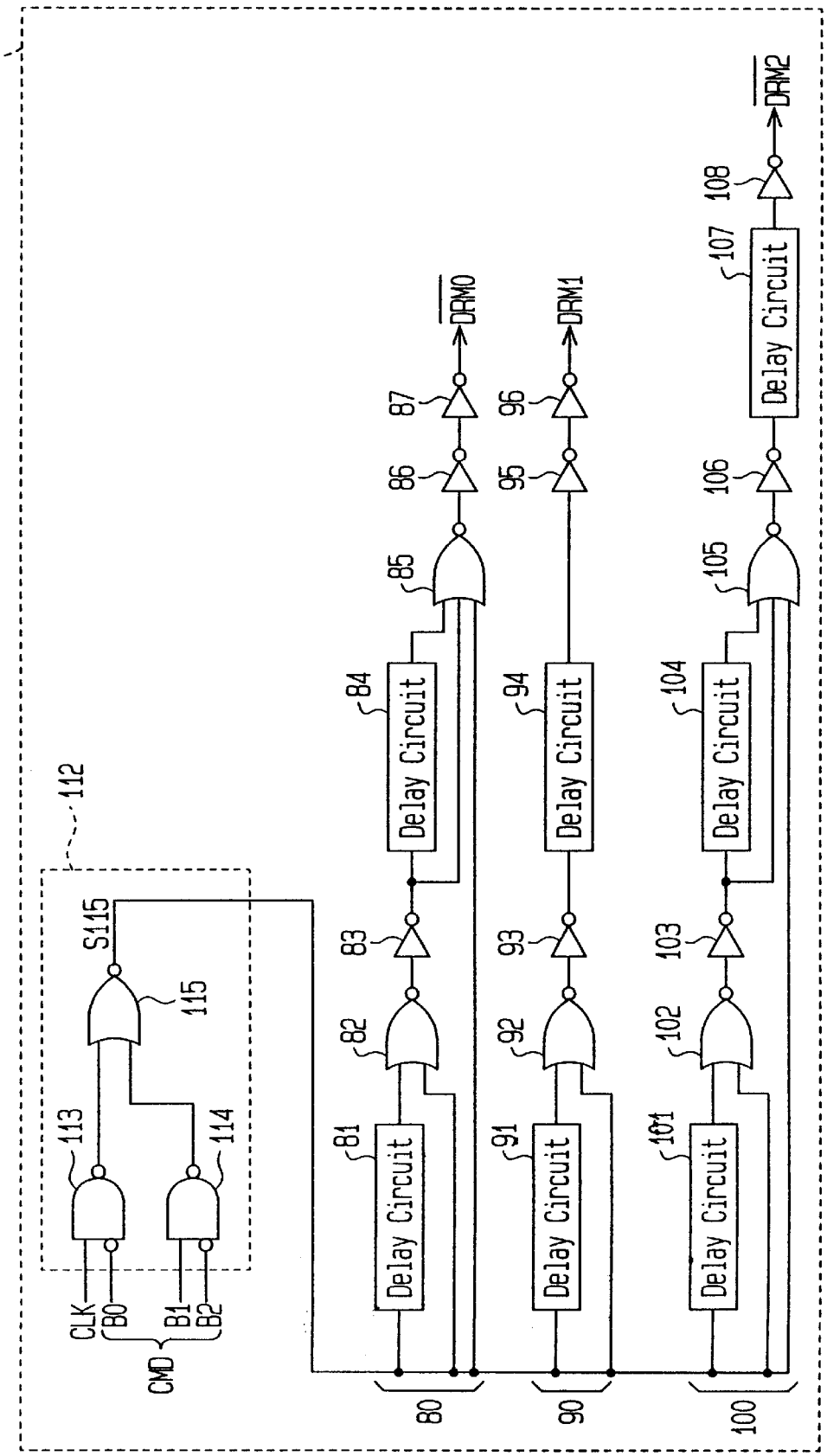
FIG. 11 is a circuit diagram showing a retention mode command determining circuit of the DRAM of FIG. 10.

As shown in FIG. 11, the retention mode command determination circuit 111 includes a command decoder 112, and the first to third control signal generating circuits 80, 90, 100.

The command decoder 112 detects whether the DRAM 110 has shifted to the retention mode from the clock signal CLK and the retention mode command CMD and sends an output signal S115 to the first to third control signal generating circuits 80, 90, 100. The command decoder 112 includes two NAND circuits 113, 114, and a NOR circuit 115. The NAND circuit 113 has a non-inverted input terminal for receiving the clock signal CLK and an inverted input terminal for receiving the bit B0. The NAND circuit 114 has a non-inverted input terminal for receiving the bit signal B1 and an inverted input terminal for receiving the bit B2. The NOR circuit 115 has two input terminals, one for receiving an output signal from the AND circuit 113 and the other for receiving an output signal from the AND circuit 114, and an output terminal for outputting a signal S115.

In FIGS. 12(*a*) to 12(*c*), it is presumed that bit B0 is set at "0", bit B1 is set at "1", and bit B2 is set at "0" when the command decoder 112 receives a high clock signal CLK. In this state, the output signals of the NAND circuits 113, 114 are both low and a positive pulse is generated in the signal S115 from the NOR circuit 115. When these conditions are met, the DRAM 110 is detected as being in the retention mode.

The first control signal generating circuit 80 generates the control signal /DRM0, which deactivates the address buffer pre-decoder 17 and the refresh address counter 18 in accordance with the signal S115 from the command decoder 112. The second control signal generating circuit 90 generates the control signal DRM1, which activates the sense amplifier driving circuit 16 in accordance with the signal S115 from the command decoder 112. The third control signal generating circuit 100 generates the control signal /DRM2, which activates the precharge circuit 30 in accordance with the signal S115 from the command decoder 112.

The operation of the DRAM 110 will now be described.

[Normal Operation Mode]

If the bits B0, B1, B2 of the retention mode command CMD sent from the controller have a combination other than (0, 1, 0), the DRAM 110 is in the normal operation mode. In the normal operation mode, the first control signal /DRM0 is high, the second control signal DRM1 is low, and the third control signal /DRM2 is high. The read operation, the write operation, and the refresh operation are performed in the same manner as the DRAM 10 of the first embodiment in the normal operation mode.

[Retention Mode]

As shown in FIG. 12, if the command decoder 112 receives a retention mode command CMD including the bits B0, B1, B2 (0, 1, 0) in synchronism with the clock signal CLK, the DRAM 110 enters the retention mode. In the retention mode, only refreshing of the memory cell array 11 is performed. In this state, the internal power supply VDD voltage decreases in accordance with the power supply VCC voltage. The internal power supply VDD voltage VDDr during the retention mode and the voltage VCCr of the external power supply VCC are set so that they are substantially equal to each other. The reference power supply VPR, VPD voltages do not decrease immediately and are maintained at VDDn/2 for a predetermined period.

When the bits B0, B1, B2 of the retention mode command CMD are (0, 1, 0), the retention mode command determination circuit 111 detects that the DRAM 110 has entered the retention mode. As a result, the command decoder 112 generates a positive pulse in the output signal S115.

In response to the positive pulse of the output signal S115, the control signal generating circuit 80 generates a negative pulse in the control signal /DRM0 which is synchronized with the rising of the output signal S115 and has a pulse width that is wider than the positive pulse. In response to the positive pulse of the output signal S115, the control signal generating circuit 100 generates a positive pulse in the control signal /DRM2 having a pulse width narrower than the pulse width of the control signal /DRM0 immediately after the output signal S115 falls. Furthermore, in response to the positive pulse of the output signal S115, the control signal generating circuit 90 generates a positive pulse in the control signal /DRM1 having a pulse width narrower than the pulse width of the control signal /DRM2 immediately after the output signal S115 falls.

The voltage of the reference power supply VPR decreases in accordance with the control signals /DRM0, DRM1, /DRM2 immediately after entering the retention mode.

As described above, the DRAM 110 of the second embodiment retains data properly in the retention mode in the same manner as the first embodiment. Furthermore, the time from when the DRAM 110 enters the retention mode to when the refresh mode is commenced is decreased.

[Third Embodiment]

A DRAM 120 according to a third embodiment of the present invention will now be described with reference to FIGS. 13 to 16. The description will center on those parts that differ from the DRAM 60 of the first embodiment.

Figure 13:
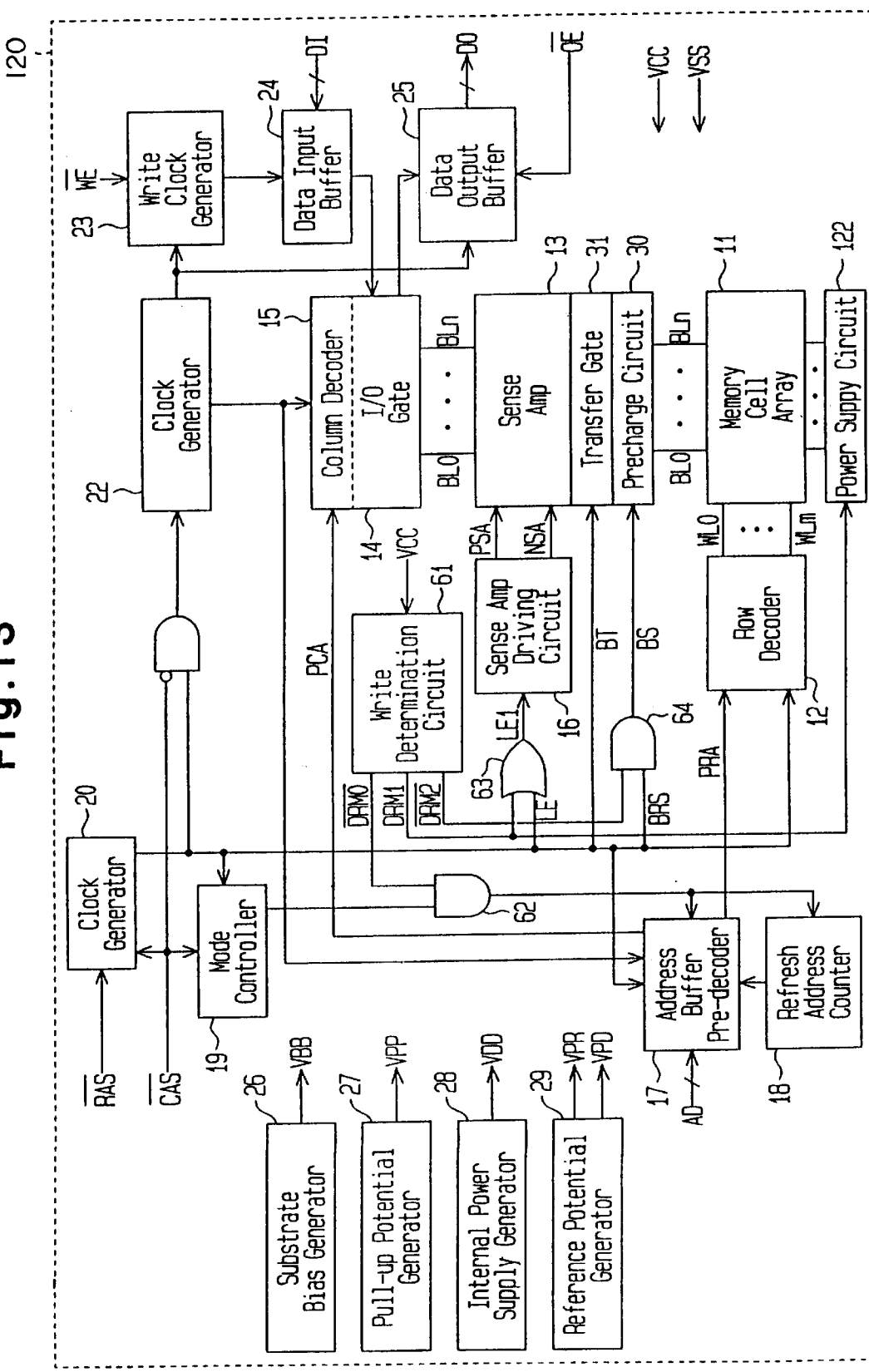
FIG. 13 is a block diagram showing a DRAM according to a third embodiment of the present invention.

As shown in FIG. 13, the DRAM 120 of the third embodiment differs from the DRAM 60 of the first embodiment in that a write determination circuit 121 is provided in lieu of the retention mode potential determination circuit 61 and a power supply circuit 122 is connected to the memory cell array 11.

The write determination circuit 121, the AND circuit 62, the OR circuit 63, the AND circuit 64, and the power supply circuit 122 adjust the precharge voltage of the bit line pairs BL0, /BL0 to BLn, /BLn so that the precharge voltage becomes substantially equal to the reference power supply VPR voltage.

Figure 15:
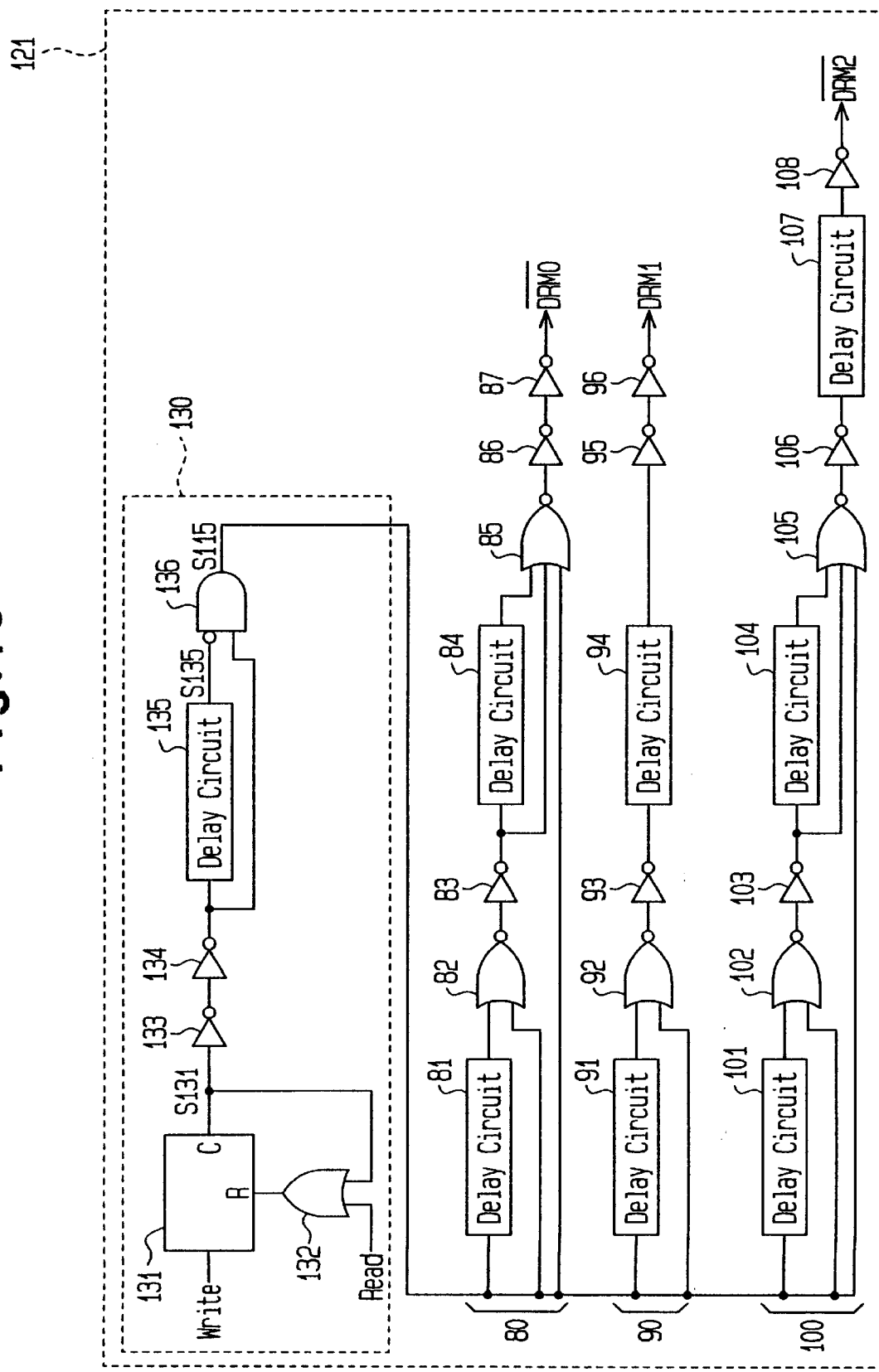
FIG. 15 is a circuit diagram showing a write determining circuit of the DRAM of FIG. 13.

The write determination circuit 121 determines whether the write operation has been conducted on the memory cell array 11 consecutively for an N number of times. As shown in FIG. 15, the write determination circuit 121 includes a write count detection circuit 130, and the first to third control signal generating circuits 80, 90, 100.

The write count detection circuit 130 includes a counter 131, an OR circuit 132, two inverters 133, 134, a delay circuit 135, and an AND circuit 136. The counter 131 counts the number of the write signals output for every write operation. The OR circuit 132 receives a read signal, which is generated during the read operation, and an output signal S131 of the counter 131. The OR circuit 132 then sends an OR signal to the reset terminal of the counter 131. The counter 131 increments the count value when receiving the write signal for an N number of times and sends a high signal S131 to the inverter 133. The counter 131 count value is reset to zero when a high read signal or a high signal S131 is received before counting the write signal for an N number of times.

The inverters 133, 134 are connected in series to the output terminal of the counter 131. The output terminal of the inverter 134 is connected to the delay circuit 135. The AND circuit 136 has an inverted input terminal connected to the output terminal of the delay circuit 135 and a non-inverted terminal connected to the output terminal of the inverter 134.

As shown in FIGS. 16(a)–16(h), when the write operation is performed in the memory cell array 11 consecutively N times, the output signal S131 of the counter 131 and the output signal of the inverter 134 both become high. After a predetermined time delay, the output signal S135 of the delay circuit 135 goes high. Thus, a positive pulse is generated in the output signal S136 of the AND circuit 136. This results in detection of the N consecutive write operations performed on the memory cell array 11.

The first control signal generating circuit 80 generates the control signal /DRM0, which deactivates the address buffer pre-decoder 17 and the refresh address counter 18 in accordance with the output signal S136 of the write count detection circuit 130. The second control signal generating circuit 90 generates the control signal DRM1, which activates the sense amplifier driving circuit 16 in accordance with the output signal S136 of the write count detection circuit 130. The third control signal generating circuit 100 generates the control signal /DRM2, which activates the precharge circuit 30 in accordance with the signal S136 from the write count detection circuit 130.

Figure 14:
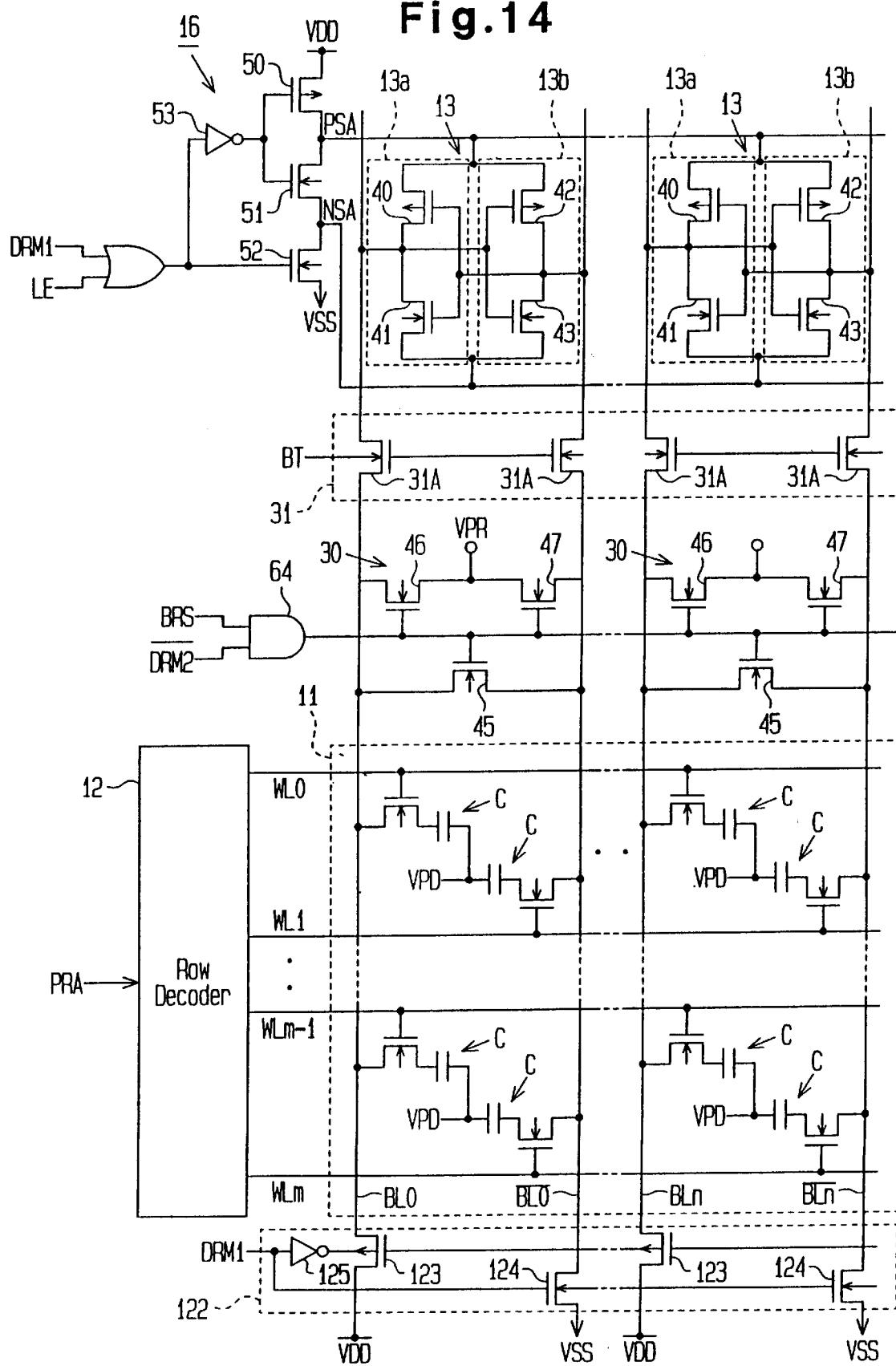
FIG. 14 is a circuit diagram showing a memory cell array of the DRAM of FIG. 13.

As shown in FIG. 14, in the power supply circuit 122, which includes a PMOS transistor 123, an NMOS transistor 124, and an inverter 125, is provided for each bit line pair BL0, /BL0 to BLn, /BLn. The PMOS transistor 123 is connected between the associated non-inverted bit line BL0 to BLn and the internal power supply VDD. The NMOS transistor 124 is connected between the associated inverted bit line /BL0 to /BLn and the internal power supply VSS. Each PMOS transistor 123 has a gate which receives the control signal DRM1 via the inverter 125. Each NMOS transistor 124 has a gate which receives the control signal DRM1. When the control signal DRM1 is high, each of the PMOS and NMOS transistors 123, 124 are activated. The non-inverted bit lines BL0, BL1,–BLn receive the internal power supply VDD via the activated PMOS transistors 123. The inverted bit lines /BL0, /BL1,–/BLn receive the low potential power supply VSS via the activated NMOS transistors 124.

The operation of the DRAM 120 will now be described with reference to FIGS. 16(a) to 16(h).

In the normal operation mode, the internal power supply VDD voltage is VDDn and the reference voltage of the sense amplifiers 13 (i.e., the voltages of the high potential and low potential power supply lines PSA, NSA) is VDDn/2. The read, write, and refresh operations of the DRAM 120 are performed in the same manner as the prior art DRAM 10.

[Write Operation]

If the write operation is performed consecutively N times in the DRAM 120, a reference potential need not be applied to the selected bit line pairs BL0, /BL0, /BLn, /BLn when the DRAM 120 is performing the write operation. A write signal having a potential need only be applied to the selected bit line pairs BL0, /BL0 to BLn, /BLn. Each time data is written during the write operation, the precharge circuit 30 is activated and the bit line pairs BL0, /BL0 to BLn, /BLn are precharged by the reference power supply VPR. As a result, the potentials at the bit line pairs BL0, /BL0 to BLn, /BLn become equal to one another. However, the drive capability of the reference potential generator 29 is relatively low and the reference power supplies VPR, VPD are provided to the entire memory cell array 11. Thus, when the bit line pairs BL0, /BL0 to BLn, /BLn are precharged after data is written, the reference power supply VPR voltage is set at one half the sum of the write signal voltages of the bit line pairs BL0, /BL0 to BLn, /BLn. Accordingly, if the write operation is performed consecutively N times, the voltage VWR of the bit line pairs BL0, /BL0 to BLn, /BLn after precharging may be offset greatly from the reference voltage VDDn/2 as shown in FIG. 16(h).

If the write operation is performed on the memory cell array 11 of the DRAM 120 N times, the counter 131 outputs a high signal S131, which is a count-up instruction. In response to the rising of the output signal S131, a positive pulse is generated in the output signal S136 of the AND circuit 136. This results in detection of the number N of write operations performed on the memory cell array 11.

In response to the positive signal of the output signal S136, the control signal generating circuit 80 generates a negative pulse in the control signal /DRM0 which is synchronized with the rising of the output signal S136 and has a pulse width that is wider than the positive pulse. In response to the positive pulse of the output signal S136, the control signal generating circuit 100 generates a positive pulse in the control signal /DRM2 having a pulse width narrower than the pulse width of the control signal /DRM0 immediately after the output signal S136 falls. Furthermore, in response to the positive pulse of the output signal S136, the control signal generating circuit 90 generates a positive pulse in the control signal /DRM1 saving a pulse width narrower than the pulse width of the control signal /DRM2 immediately after the output signal S136 falls.

In response to the low control signal /DRM0, the control signal sent to the address buffer pre-decoder 17 and the refresh address counter 18 from the mode controller 19 is blocked. Thus, the address buffer pre-decoder 17 and the refresh address counter 18 are deactivated and the predecode signal PRA is not output. Accordingly, none of the word lines WL0 to WLm nor the memory cells C are selected.

Subsequently, if the control signal /DRM2 falls, the second precharge signal BS goes low regardless of the level of the first precharge signal BRS. This ends the precharging of the bit line pairs BL0, /BL0 to BLn, /BLn. In this state, the precharge voltage VWR of the bit line pairs BL0, /BL0 to BLn, /BLn is maintained at a value greater than VDDn/2 for a predetermined time due to the parasitic capacitance of the reference power supply VPR at the bit line pairs BL0, /BL0 to BLn, /BLn and the sense amplifiers 13.

Afterward, when the control signal DRM1 rises, the PMOS and NMOS transistors 123, 124 are activated. Thus, the non-inverted bit lines BL0, BL1–BLn receive the internal power supply voltage VDD, and the inverted bit lines /BL0, /BL1,–/BLn receive the low potential power supply voltage VSS (ground voltage).

When the control signal DRM1 rises, the activation signal LE1 rises regardless of the level of the activation signal LE. The sense amplifier driving circuit 16 is activated in response to the activation signal LE1. The high potential power supply line PSA voltage is set at the voltage VDDn of the internal power supply VDD, and the low potential power supply line NSA voltage is set at the voltage (0V) of the low potential power supply VSS. As a result, each of the sense amplifiers 13 are activated. Thus, the voltage at the bit line pairs BL0, /BL0 to BLn, /BLn corresponding to the sense amplifiers 13 is set at voltage VDDn or 0V depending on the operation of the sense amplifiers 13. Since none of the memory cells C are selected in this state, the data of the memory cells C are prevented from being destroyed by the voltage at the bit line pairs BL0, /BL0 to BLn, /BLn.

When the control signal DRM1 falls, the power supply circuit 122 is deactivated. Thus, the supply of power supply voltage to the bit line pairs BL0, /BL0 to BLn, /BLn is stopped. Furthermore, the sense amplifier driving circuit 16 is deactivated and the high potential and low potential power supply lines PSA, NSA are short circuited. Thus, the high potential and low potential power supply lines PSA, NSA are stabilized at VDDn/2.

Subsequently, when the control signal /DRM2 rises, the second precharge signal BR rises since the first precharge signal BRS is high. The precharge circuit 30 is activated in response to the second precharge signal BS. This precharges the bit line pairs BL0, /BL0 to BLn, /BLn with the reference power supply VPR, and the potentials at the bit line pairs BL0, /BL0 to BLn, /BLn become equal to one another. In this state, the drive capability of the reference potential generator 29 is low. Thus, the parasitic capacitance at the bit line pairs BL0, /BL0 to BLn, /BLn and the sense amplifiers 13 is large relative to the voltage of the reference power supply VPR. The voltage of the bit line pairs BL0, /BL0 to BLn, /BLn is set at VDDn/2 and the voltage of the reference power supply VPR substantially follows the voltage alteration of the bit line pairs BL0, /BL0 to BLn, /BLn and is set at VDDn/2.

Accordingly, even if a read command is issued by the controller immediately after the write operation is performed on the DRAM 120 consecutively N times, the address buffer pre-decoder 17 and the refresh address counter 18 are deactivated in response to a low control signal /DRM0. Thus, data is not read from the memory cell array 11. The voltage of the bit line pairs BL0, /BL0 to BLn, /BLn has already been set at VDDn/2 after the control signal /DRM0 rises. Accordingly, if a read command is issued from the controller after the control signal /DRM0 rises, the address buffer pre-decoder 17 and the refresh address counter 18 are activated in response to the control signal from the mode controller 19 and the normal read operation is performed.

As described above, in the DRAM 120 of the third embodiment, N consecutive write operations (i.e., the voltage VWR of the bit line pairs BL0, /BL0 to BLn, /BLn is greater than the reference voltage VDDn/2 of the sense amplifiers 13) are detected by the write determination circuit 121. Precharging of the bit line pairs BL0, /BL0 to BLn, /BLn is completed in accordance with the detection result without the word lines WL0 to WLm of the memory cell array 11 being selected. The power supply circuit 122 sends the internal power supply VDD voltage and the ground voltage to the bit line pairs BL0, /BL0 to BLn, /BLn and the voltage VDDr of the internal power supply VDD to the sense amplifiers 13 to set the voltages at the bit line pairs BL0, /BL0 to BLn, /BLn at VDDr and the ground voltage. The bit line pairs BL0, /BL0 to BLn, /BLn are then precharged to set the voltage of the bit line pairs BL0, /BL0 to BLn, /BLn at VDDn/2. Due to the precharge, the voltage of the reference power supply VPR and the voltage of the bit line pairs BL0, BL0 to BLn, /BLn decrease to voltage VDDn/2 at substantially the same timing. Thus, data is read from the memory cells C immediately after the DRAM 120 performs the write operation N times without destroying the data in the memory cells C.

It should be apparent to those skilled in the art that the present invention may be embodied in many other specific forms without departing from the spirit or scope of the invention. Particularly, it should be understood that the present invention may be embodied in the following forms.

In the first and second embodiments, the power supply circuit 122 of the third embodiment may be connected to the bit line pairs BL0, /BL0 to BLn, /BLn of the memory cell array 11, and the reference power supply VPR voltage may be decreased at an earlier stage in the retention mode. The power supply circuit 122 may be connected to the retention mode potential determination circuit and the retention mode command determination circuit 111 of the first and second embodiments and be controlled by the second control signal DRM1.

In the first and second embodiments, the OR circuit 63 may be eliminated and the sense amplifier driving circuit 16 and the clock generator 20 may be operated by the activation signal LE. In this case, the power supply circuit 122 of the third embodiment may be connected to the bit line pairs BL0, /BL0 to BLn, /BLN to advance the decrease in the reference power supply VPR voltage during the retention mode. The power supply circuit 122 is controlled by the second control signal DRM1.

The write determination circuit 121 of the third embodiment may be provided in the first and second embodiments. This readily sets the reference power supply VPR at a predetermined value not only immediately after the DRAMs 60, 110 enter the retention mode, but also when the write operation is performed consecutively N times.

Also in the third embodiment, the OR circuit 63 may be eliminated and the sense amplifier driving circuit 16 may be operated by the activation signal LE of the clock generator 20.

In the third embodiment, the power supply circuit 122 may be eliminated.

In the above embodiments, the AND circuit 62, the OR circuit 63, and the AND circuit 64 may be replaced by other logic circuits as long as they achieve the same function. The present examples and embodiments are to be considered as illustrative and not restrictive, and the invention is not to be limited to the details given herein, but may be modified within the scope and equivalence of the appended claims.

What is claimed is:

1. A semiconductor memory comprising:

a plurality of memory cells;

a plurality of bit line pairs connected to the memory cells, wherein each bit line pair includes a first bit line and a second bit line;

a precharge circuit connected to the bit line pairs to selectively provide the bit line pairs with a reference power supply voltage, wherein the precharge circuit stops providing the bit line pairs with the reference power supply voltage when the memory cells are accessed to transmit a data signal to one of the memory cells via a corresponding one of the bit line pairs, and provides the bit line pairs with the reference power supply voltage as a precharge voltage when the memory cells are not being accessed, the precharge circuit providing the precharge voltage in response to one of first and second precharge control signals, the first precharge control signal being in sync with a semiconductor memory operation cycle, and the second precharge control signal being independent from the semiconductor memory operation cycle; and a correction circuit for adjusting the precharge voltage in accordance with a difference between the precharge voltage of the bit line pairs and the reference power supply voltage so that the precharge voltage of the bit line pairs becomes substantially equal to the reference power supply voltage.

2. The semiconductor memory according to claim 1, wherein the reference power supply voltage is set at one half of an internal power supply voltage, and the internal power supply voltage varies in accordance with an external power supply voltage.

3. The semiconductor memory according to claim 2, wherein the correction circuit includes:

a retention mode determination circuit for detecting when the semiconductor memory is in a retention mode;

a prohibition circuit connected to the retention mode determination circuit to prohibit access to the memory cells in accordance with the determination result of the retention mode determination circuit;

a sense amplifier connected to each of the bit line pairs, wherein the sense amplifier provides the first bit line of the associated bit line pair with the internal power supply voltage and the second bit line of the associated bit line pair with a ground power supply voltage; and a control circuit connected between the retention mode determination circuit and the precharge circuit to control the precharge circuit, wherein, during prohibition of access to the memory cells by the prohibition circuit, the control circuit stops the bit line pairs from receiving the reference power supply voltage when the sense amplifiers are providing the internal power supply voltage and the ground power supply voltage, and controls the precharge circuit so that the bit line pairs are connected to the reference power supply after the sense amplifiers stop providing the internal power supply voltage and the ground supply voltage.

4. The semiconductor memory according to claim 3, wherein the retention mode determination circuit determines that the semiconductor memory is in the retention mode in accordance with changes in the external power supply voltage.

5. The semiconductor memory according to claim 3, wherein the retention mode determination circuit receives a retention mode command for determining that the semiconductor memory is in the retention mode.

6. The semiconductor memory according to claim 3, wherein the sense amplifiers amplify the potential at the bit line pairs.

7. The semiconductor memory according to claim 3, wherein the retention mode determination circuit includes a voltage detection circuit for receiving power from the external power supply and the ground power supply, and generates a pulse signal indicating that the semiconductor memory is in the retention mode when the difference between the external power supply voltage and the ground power supply voltage is less than a predetermined value.

8. The semiconductor memory according to claim 7, wherein the retention mode determination circuit has a plurality of control signal generating circuits connected to the voltage detection circuit, each of the control signal generating circuits generating a control signal in response to the pulse signal from the voltage detection circuit and sending the control signal to the correction circuit.

9. The semiconductor memory according to claim 2, wherein the correction circuit includes:

a write determination circuit for detecting the difference between the precharge voltage of the bit line pairs and the reference power supply voltage when a predetermined number of consecutive write operations are performed on the memory cells;

a prohibition circuit connected to the write determination circuit to prohibit access to the memory cells in accordance with the detection result of the write determination circuit;

a sense amplifier connected to each of the bit line pairs, wherein the sense amplifier provides the first bit line of each of the bit line pairs with the internal power supply voltage and the second bit line of each of the bit line pairs with a ground power supply voltage; and a control circuit connected between the write determination circuit and the precharge circuit to control the precharge circuit, wherein, during prohibition of access to the memory cells by the prohibition circuit, the control circuit stops the bit line pairs from receiving the reference power supply voltage when the sense amplifiers are providing the power supply voltage and the ground supply voltage, and controls the precharge circuit so that the bit line pairs are connected to the reference power supply after the sense amplifiers stop providing the internal power supply voltage and the ground power supply voltage.

10. The semiconductor memory according to claim 9, wherein the sense amplifiers amplify the potential at the bit line pairs.

11. The semiconductor memory according to claim 9, further comprising a power supply circuit for connecting the first bit line of each of the bit line pairs to the internal power supply and connecting the second bit line of each of the bit line pairs to the ground power supply.

12. The semiconductor memory according to claim 9, wherein the write determination circuit includes a write count detection circuit for detecting the number of consecutive write operations performed and generating a pulse signal when the number of write operations reaches the predetermined number.

13. The semiconductor memory according to claim 12, wherein the write determination circuit has a plurality of control signal generating circuits connected to the write count detection circuit, each of the control signal generating circuits generating a control signal in response to the pulse signal from the voltage detection circuit and sending the control signal to the correction circuit.

* * * * *